(12) United States Patent
Shionoiri et al.

(10) Patent No.: US 8,593,840 B2
(45) Date of Patent: Nov. 26, 2013

(54) BOOSTING CIRCUIT AND RFID TAG INCLUDING BOOSTING CIRCUIT

(75) Inventors: Yutaka Shionoiri, Kanagawa (JP); Junpei Sugao, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 453 days.

(21) Appl. No.: 13/031,715

(22) Filed: Feb. 22, 2011

(65) Prior Publication Data

US 2011/0215787 A1  Sep. 8, 2011

(30) Foreign Application Priority Data

Mar. 2, 2010  (JP) ................ 2010-045752

(51) Int. Cl.
*H02M 3/18* (2006.01)
*G05F 1/10* (2006.01)

(52) U.S. Cl.
USPC .......................................... 363/60; 327/536

(58) Field of Classification Search
USPC ................. 363/59, 60; 327/534–537
See application file for complete search history.

(56) References Cited

U.S. PATENT DOCUMENTS

| | | | |
|---|---|---|---|
| 6,121,821 A * | 9/2000 | Miki .............................. | 327/536 |
| 6,515,535 B2 | 2/2003 | Myono | |
| 6,603,346 B2 * | 8/2003 | Sawada et al. ................. | 327/536 |
| 6,878,981 B2 * | 4/2005 | Eshel ............................ | 257/299 |
| 6,946,899 B2 | 9/2005 | Myono | |
| 7,602,231 B2 * | 10/2009 | Yamamoto et al. ........... | 327/536 |
| 7,608,531 B2 | 10/2009 | Isa et al. | |
| 7,687,808 B2 | 3/2010 | Umezaki | |
| 7,804,203 B2 | 9/2010 | Kato | |
| 7,858,451 B2 | 12/2010 | Maekawa et al. | |
| 2001/0010477 A1 | 8/2001 | Myono | |
| 2003/0058030 A1 | 3/2003 | Myono | |
| 2006/0214008 A1 | 9/2006 | Asami et al. | |
| 2008/0079001 A1 | 4/2008 | Umezaki et al. | |
| 2008/0093935 A1 | 4/2008 | Saito et al. | |
| 2008/0143401 A1 | 6/2008 | Rai et al. | |
| 2010/0133533 A1 | 6/2010 | Umezaki | |

FOREIGN PATENT DOCUMENTS

| | | |
|---|---|---|
| CN | 101174789 A | 5/2008 |
| CN | 101523419 A | 9/2009 |
| JP | 02-046162 A | 2/1990 |
| JP | 09-051669 A | 2/1997 |
| JP | 2001-136733 A | 5/2001 |

(Continued)

OTHER PUBLICATIONS

International Search Report, PCT Application No. PCT/JP2011/053435, dated May 10, 2011, 3 pages.

(Continued)

*Primary Examiner* — Matthew Nguyen
(74) *Attorney, Agent, or Firm* — Fish & Richardson P.C.

(57) ABSTRACT

One object is to provide a boosting circuit whose boosting efficiency is enhanced. Another object is to provide an RFID tag including a boosting circuit whose boosting efficiency is enhanced. A node corresponding to an output terminal of a unit boosting circuit or a gate electrode of a transistor connected to the node is boosted by bootstrap operation, so that a decrease in potential which corresponds to substantially the same as the threshold potential of the transistor can be prevented and a decrease in output potential of the unit boosting circuit can be prevented.

23 Claims, 13 Drawing Sheets

(56) References Cited

FOREIGN PATENT DOCUMENTS

| | | |
|---|---|---|
| JP | 2001-286125 A | 10/2001 |
| JP | 2002-084740 A | 3/2002 |
| JP | 2006-109429 A | 4/2006 |
| JP | 2008-112440 A | 5/2008 |
| JP | 2008-113269 A | 5/2008 |
| KR | 10-0259466 B | 6/2000 |
| KR | 2001-0078052 A | 8/2001 |
| KR | 2009-0066270 A | 6/2009 |
| WO | 2008/044559 A1 | 4/2008 |

OTHER PUBLICATIONS

Written Opinion, PCT Application No. PCT/JP2011/053435, dated May 10, 2011, 5 pages.

* cited by examiner

BOOSTING CIRCUIT AND RFID TAG INCLUDING BOOSTING CIRCUIT

TECHNICAL FIELD

The disclosed invention relates to a boosting circuit and an RFID tag including the boosting circuit.

BACKGROUND ART

In recent years, semiconductor devices which transmit and receive data wirelessly have been actively developed. The semiconductor device which transmits and receives data wirelessly is called a radio frequency identification (RFID) tag, an ID tag, an IC tag, an IC chip, an RF tag, a wireless tag, an electronic tag, a wireless chip, a transponder, and the like, and those put in practical use generally include a silicon substrate.

The semiconductor devices which transmit and receive data wirelessly (hereinafter referred to as RFID tags) generally have a structure in which inside circuits are made to operate by power obtained wirelessly. In the structure, each circuit is made to operate by using power from an antenna through a power supply circuit, a constant voltage circuit, or the like.

As an RFID tag becomes to have a higher function, it is required to mount a circuit that needs high voltage for operation. For example, in the case where a memory element is mounted on an RFID tag, it is necessary to increase voltage supplied from the power supply circuit or the constant voltage circuit. In order to increase the voltage of power, a structure in which an RFID tag is provided with a boosting circuit is considered (see Patent Document 1).

REFERENCE

[Patent Document 1] Japanese Published Patent Application No. 2006-109429

DISCLOSURE OF INVENTION

A conventionally used boosting circuit (a charge pump circuit) has a structure where a plurality of unit boosting circuits is connected in series. The unit boosting circuit includes a transistor in which a gate electrode and a source electrode are connected to each other and a capacitor in which one electrode is connected to a drain electrode of the transistor and a clock signal or an inverted clock signal is applied to the other electrode. The boosting circuit has the following mechanism: when an input signal is input to a source electrode of a transistor in a first stage unit boosting circuit, in each unit boosting circuit, the input signal is boosted up by capacitive coupling of a capacitor to which a clock signal or an inverted clock signal is input, so that a signal obtained by boosting up the input signal is output from a drain electrode of a transistor in a last stage unit boosting circuit.

However, there is a problem in that when a transistor in which a gate electrode and a source electrode are connected to each other is used in a unit boosting circuit, the potential boosted in each unit boosting circuit is reduced by threshold potential of a transistor in the next stage unit boosting circuit. In other words, in the case where transistors in unit boosting circuits each have substantially the same threshold potential, the potential of a signal output from the boosting circuit is reduced by the product of threshold potential of a transistor in a unit boosting circuit multiplied by the number of unit boosting circuits; thus, the boosting efficiency of the boosting circuit is prevented.

When the potential applied to one electrode of a capacitor is boosted by capacitive coupling of the capacitor in a unit boosting circuit, a transistor is brought out of conduction. At this time, when the off-state current of the transistor is not sufficiently small, leakage current is generated between a source and a drain of the transistor, which leads to another problem in that boosting due to capacitive coupling is not performed sufficiently.

In view of the foregoing problems, an object of one embodiment of the disclosed invention is to provide a boosting circuit whose boosting efficiency is enhanced. Another object is to provide an RFID tag including a boosting circuit whose boosting efficiency is enhanced.

According to one embodiment of the disclosed invention, a node corresponding to an output terminal of a unit boosting circuit is boosted by bootstrap operation, so that a decrease in output potential of the unit boosting circuit can be prevented.

According to another embodiment of the disclosed invention, a gate electrode of a transistor connected to a node corresponding to an output terminal of a unit boosting circuit is boosted by bootstrap operation, so that a decrease in potential which corresponds to substantially the same as the threshold potential of the transistor can be prevented and a decrease in output potential of the unit boosting circuit can be prevented.

According to another embodiment of the disclosed invention, a material which can make an off-state current sufficiently small, for example, an oxide semiconductor is used for a transistor included in a boosting circuit, so that leakage current in a non-conduction state of the transistor can be reduced.

Specifically, any of the following structures can be employed, for example.

One embodiment of the disclosed invention is a boosting circuit including a first transistor including a first gate electrode; a first source electrode; and a first drain electrode, a second transistor including a second gate electrode; a second source electrode; and a second drain electrode, a first capacitor, and a second capacitor, in which the first gate electrode, one of the first source electrode and the first drain electrode, and one of the second source electrode and the second drain electrode are electrically connected to one another, in which the other of the first source electrode and the first drain electrode, the second gate electrode, one electrode of the first capacitor, and one electrode of the second capacitor are electrically connected to one another, in which the other of the second source electrode and the second drain electrode and the other electrode of the first capacitor are electrically connected to each other, in which an input signal is input to the one of the first source electrode and the first drain electrode, in which a clock signal is input to the other electrode of the second capacitor, and in which a signal obtained by boosting the input signal is output from the other of the first source electrode and the first drain electrode.

Another embodiment of the disclosed invention is a boosting circuit including n stages of unit boosting circuits (n is a natural number and an even number) electrically connected to each other in series. Each unit boosting circuit includes a first transistor including a first gate electrode; a first source electrode; and a first drain electrode, a second transistor including a second gate electrode; a second source electrode; and a second drain electrode, a first capacitor, and a second capacitor, in which the first gate electrode, one of the first source electrode and the first drain electrode, and one of the second source electrode and the second drain electrode are electrically connected to one another, in which the other of the first source electrode and the first drain electrode, the second gate electrode, one electrode of the first capacitor, and one electrode of the second capacitor are electrically connected to one another, and in which the other of the second source electrode and the second drain electrode and the other electrode of the first capacitor are electrically connected to each other. An input signal is input to the one of the first source electrode and the first drain electrode in a first stage unit boosting circuit, a clock signal is input to the other electrode of the second capacitor in a (2M−1)th stage unit boosting circuit (M is a natural number which satisfies 1≤M≤n/2), an inverted clock signal is input to the other electrode of the second capacitor in a 2M-th stage unit boosting circuit, and a signal obtained by boosting the input signal is output from the other of the first source electrode and the first drain electrode in an n-th stage unit boosting circuit.

Another embodiment of the disclosed invention is a boosting circuit including n stages of unit boosting circuits (n is a natural number) electrically connected to each other in series. Each unit boosting circuit includes a first transistor including a first gate electrode; a first source electrode; and a first drain electrode, a second transistor including a second gate electrode; a second source electrode; and a second drain electrode, a first capacitor, and a second capacitor, in which the first gate electrode, one of the first source electrode and the first drain electrode, and one of the second source electrode and the second drain electrode are electrically connected to one another, in which the other of the first source electrode and the first drain electrode, the second gate electrode, one electrode of the first capacitor, and one electrode of the second capacitor are electrically connected to one another, and in which the other of the second source electrode and the second drain electrode and the other electrode of the first capacitor are electrically connected to each other. An input signal is input to the one of the first source electrode and the first drain electrode in a first stage unit boosting circuit, a signal obtained by boosting the input signal is output from the other of the first source electrode and the first drain electrode in an n-th stage unit boosting circuit, and an inverted clock signal is input to the other electrode of the second capacitor in the n-th stage unit boosting circuit. For all values of M (M is a natural number which satisfies 1≤M≤(n−1)), when n is an even number and M is an odd number, or n is an odd number and M is an even number, a clock signal is input to the other electrode of the second capacitor in a M-th stage unit boosting circuit, and when n is an even number and M is an even number, or n is an odd number and M is an odd number, an inverted clock signal is input to the other electrode of the second capacitor in the M-th stage unit boosting circuit.

The unit boosting circuit further includes a third transistor including a third gate electrode; a third source electrode; and a third drain electrode, in which one of the third source electrode and the third drain electrode, the other of the second source electrode and the second drain electrode, and the other electrode of the first capacitor are electrically connected to one another, in which the other of the third source electrode and the third drain electrode and a low-potential power supply are electrically connected to each other, in which a reset signal is input to the third gate electrode, and in which a potential of the low-potential power supply is lower than a potential of the input signal.

Another embodiment of the disclosed invention is a boosting circuit including n stages of unit boosting circuits (n is a natural number and an even number) electrically connected to each other in series. Each unit boosting circuit includes a first transistor including a first gate electrode; a first source electrode; and a first drain electrode, a second transistor including a second gate electrode; a second source electrode; and a second drain electrode, a third transistor including a third gate electrode; a third source electrode; and a third drain electrode, a fourth transistor including a fourth gate electrode; a fourth source electrode; and a fourth drain electrode, a first capacitor, a second capacitor, and an analog switch including first to fourth terminals, in which the first gate electrode, one of the first source electrode and the first drain electrode, one of the second source electrode and the second drain electrode, and one of the fourth source electrode and the fourth drain electrode are electrically connected to one another, in which the other of the first source electrode and the first drain electrode, the second gate electrode, one electrode of the first capacitor, and the fourth gate electrode are electrically connected to one another, in which the other of the second source electrode and the second drain electrode, the other electrode of the first capacitor, and one of the third source electrode and the third drain electrode are electrically connected to one another, in which the other of the third source electrode and the third drain electrode and a low-potential power supply are electrically connected to each other, and in which the other of the fourth source electrode and the fourth drain electrode, one electrode of the second capacitor, and the first terminal of the analog switch are electrically connected to one another. An input signal is input to the one of the first source electrode and the first drain electrode in a first stage unit boosting circuit, a clock signal is input to the third gate electrode and the other electrode of the second capacitor in a (2M−1)th stage unit boosting circuit (M is a natural number which satisfies 1≤M≤n/2), an inverted clock signal is input to the third gate electrode and the other electrode of the second capacitor in the 2M-th stage unit boosting circuit, a clock signal is input to the second terminal of the analog switch and an inverted clock signal is input to the third terminal of the analog switch in a (2M−1)th stage unit boosting circuit, an inverted clock signal is input to the second terminal of the analog switch and a clock signal is input to the third terminal of the analog switch in the 2M-th stage unit boosting circuit, a signal obtained by boosting the input signal is output from the other of the fourth source electrode and the fourth drain electrode in an n-th stage unit boosting circuit, a potential of the low-potential power supply is lower than a potential of the input signal, and the fourth terminal of the analog switch in a (K−1)th stage unit boosting circuit (K is a natural number which satisfies 2≤K≤n) is electrically connected to one of the first source electrode and the first drain electrode in a K-th stage unit boosting circuit.

Another embodiment of the disclosed invention is a boosting circuit including n stages of unit boosting circuits (n is a natural number) electrically connected to each other in series. Each unit boosting circuit includes a first transistor including a first gate electrode; a first source electrode; and a first drain electrode, a second transistor including a second gate electrode; a second source electrode; and a second drain electrode, a third transistor including a third gate electrode; a third source electrode; and a third drain electrode, a fourth transistor including a fourth gate electrode; a fourth source electrode; and a fourth drain electrode, a first capacitor, a second capacitor, and an analog switch including first to fourth terminals, in which the first gate electrode, one of the first source electrode and the first drain electrode, one of the second source electrode and the second drain electrode, and one of the fourth source electrode and the fourth drain electrode are electrically connected to one another, in which the other of the first source electrode and the first drain electrode, the second gate electrode, one electrode of the first capacitor, and the fourth gate electrode are electrically connected to one another, in which the other of the second source electrode and the second drain electrode, the other electrode of the first capacitor, and one of the third source electrode and the third drain electrode are electrically connected to one another, in which the other of the third source electrode and the third drain electrode and a low-potential power supply are electrically connected to each other, and in which the other of the fourth source electrode and the fourth drain electrode, one electrode of the second capacitor, and the first terminal of the analog switch are electrically connected to one another. An input signal is input to the one of the first source electrode and the first drain electrode in a first stage unit boosting circuit, a signal obtained by boosting the input signal is output from the other of the fourth source electrode and the fourth drain electrode in an n-th stage unit boosting circuit, a potential of the low-potential power supply is lower than a potential of the input signal, and the fourth terminal of the analog switch in a (K−1)th stage unit boosting circuit (K is a natural number which satisfies 2≤K≤n) is electrically connected to one of the first source electrode and the first drain electrode in a K-th stage unit boosting circuit. For all values of M (M is a natural number which satisfies 1≤M≤(n−1)), when n is an even number and M is an odd number, or n is an odd number and M is an even number, in a M-th stage, a clock signal is input to the third gate electrode and the other electrode of the second capacitor; a clock signal is input to the second terminal of the analog switch; and an inverted clock signal is input to the third terminal of the analog switch, and when n is an even number and M is an even number, or n is an odd number and M is an odd number, in the M-th stage, an inverted clock signal is input to the third gate electrode and the other electrode of the second capacitor; an inverted clock signal is input to the second terminal of the analog switch; and a clock signal is input to the third terminal of the analog switch.

Here, the following is preferable: the analog switch includes a fifth transistor that is an n-channel transistor including a fifth gate electrode; a fifth source electrode; and a fifth drain electrode, and a sixth transistor that is a p-channel transistor including a sixth gate electrode; a sixth source electrode; and a sixth drain electrode, in which one of the fifth source electrode and the fifth drain electrode and one of the sixth source electrode and the sixth drain electrode are electrically connected to each other so as to function as the first terminal of the analog switch, in which the fifth gate electrode or the sixth gate electrode functions as the second terminal of the analog switch or the third terminal of the analog switch, and in which the other of the fifth source electrode and the fifth drain electrode and the other of the sixth source electrode and the sixth drain electrode are electrically connected to each other so as to function as the fourth terminal of the analog switch. The fifth transistor preferably includes an oxide semiconductor material.

It is preferable that the first transistor, the second transistor, and the fourth transistor each include an oxide semiconductor material.

Another embodiment of the disclosed invention is an RFID tag including the above boosting circuit.

Note that in this specification and the like, the term "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term "electrode" or "wiring" does not limit a function of a component. For example, an "electrode" is sometimes used as part of a "wiring", and vice versa. Further, the term "electrode" or "wiring" can include the case where a plurality of "electrodes" or "wirings" is formed in an integrated manner. Functions of a "source" and a "drain" may sometimes be switched when transistors of different polarities are employed or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

According to one embodiment of the disclosed invention, a node corresponding to an output terminal of a unit boosting circuit is boosted by bootstrap operation, so that a decrease in output potential of the unit boosting circuit can be prevented. Therefore, a boosting circuit whose boosting efficiency is enhanced can be provided.

According to another embodiment of the disclosed invention, a gate electrode of a transistor connected to a node corresponding to an output terminal of a unit boosting circuit is boosted by bootstrap operation, so that a decrease in potential which corresponds to substantially the same as the threshold potential of the transistor can be prevented and a decrease in output potential of the unit boosting circuit can be prevented. Therefore, a boosting circuit whose boosting efficiency is enhanced can be provided.

According to another embodiment of the disclosed invention, a material which can make an off-state current sufficiently small, for example, an oxide semiconductor is used for a transistor included in a boosting circuit, so that a decrease in output potential caused by leakage current in a non-conduction state of the transistor can be suppressed. Therefore, a boosting circuit whose boosting efficiency is enhanced can be provided.

Another embodiment of the disclosed invention can provide an RFID tag including a boosting circuit whose boosting efficiency is enhanced.

BEST MODE FOR CARRYING OUT THE INVENTION

Figure 1:
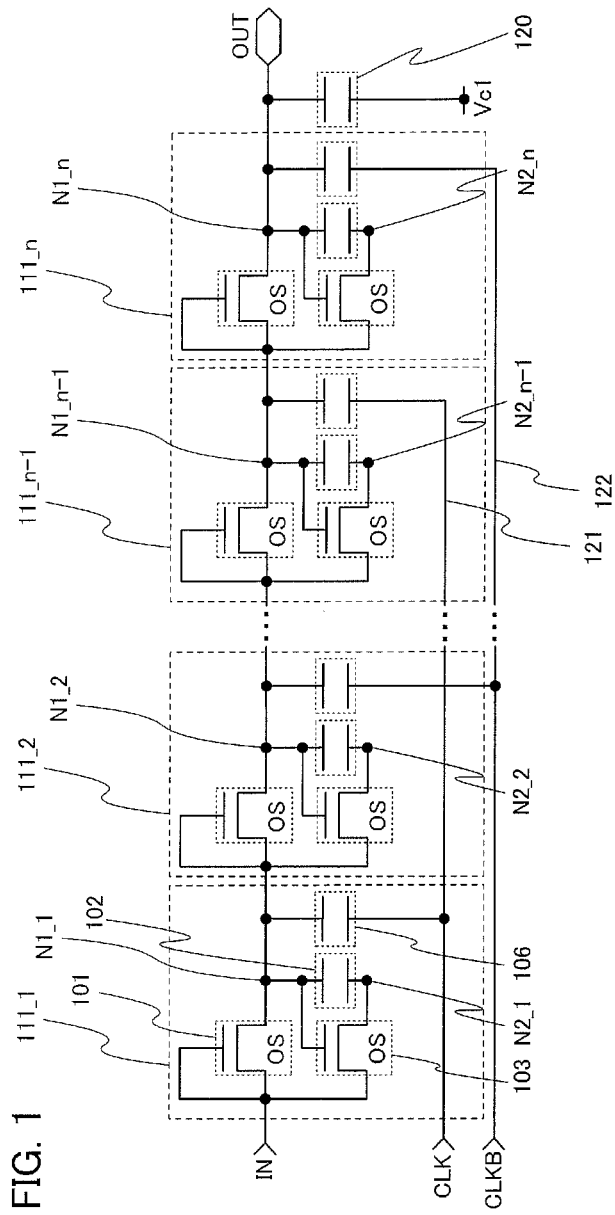
FIG. 1 is a circuit diagram of a boosting circuit according to one embodiment of the disclosed invention.

Examples of embodiments of the present invention will be described below with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description in the following embodiments.

Note that the position, size, range, and the like of each component illustrated in the drawings and the like are not accurately represented in some cases for easy understanding. Therefore, the disclosed invention is not necessarily limited to the position, size, range, and the like disclosed in the drawings and the like.

In this specification and the like, ordinal numbers such as "first", "second", and "third" are used in order to avoid confusion among components, and the terms do not limit the number of components numerically.

Embodiment 1

In this embodiment, a boosting circuit according to one embodiment of the disclosed invention will be described with reference to FIG. 1, FIG. 2, and FIG. 3. Note that in a circuit diagram, "OS" may be written beside a transistor in order to indicate that the transistor includes an oxide semiconductor.
<Circuit Configuration>

An example of a circuit configuration of a boosting circuit according to one embodiment of the disclosed invention will be described with reference to a circuit diagram of FIG. 1.

A boosting circuit illustrated in FIG. 1 is formed with n stages of unit boosting circuits 111_1 to 111_$n$ (n is a natural number) which are electrically connected to each other in series. Here, a unit boosting circuit forms one stage of the boosting circuit.

Each of the unit boosting circuits 111_1 to 111_$n$ includes a transistor 101, a capacitor 102, a transistor 103, and a capacitor 106. Note that in the case where the electrostatic capacitance of a gate insulating layer of the transistor 103 is large, the capacitor 102 may be omitted because the transistor 103 can also function as the capacitor 102.

Each of the unit boosting circuits 111_1 to 111_$n$ has the following structure: a gate electrode of the transistor 101, one of a source electrode and a drain electrode of the transistor 101, and one of a source electrode and a drain electrode of the transistor 103 are electrically connected to one another; the other of the source electrode and the drain electrode of the transistor 101, a gate electrode of the transistor 103, one electrode of the capacitor 102, and one electrode of the capacitor 106 are electrically connected to one another; and the other of the source electrode and the drain electrode of the transistor 103 and the other electrode of the capacitor 102 are electrically connected to each other.

In an m-th stage unit boosting circuit (in is a natural number which satisfies $1 \leq M \leq n$), a portion where the other of the source electrode and the drain electrode of the transistor 101, the gate electrode of the transistor 103, the one electrode of the capacitor 102, and the one electrode of the capacitor 106 are connected is called a node N1_m. Further, in the m-th stage unit boosting circuit, a portion where the other of the source electrode and the drain electrode of the transistor 103 and the other electrode of the capacitor 102 are connected is called a node N2_m.

The one of the source electrode and the drain electrode of the transistor 101 in a K-th stage unit boosting circuit (K is a natural number which satisfies $2 \leq K \leq n$) and the other of the source electrode and the drain electrode of the transistor 101 in a (K−1)th stage unit boosting circuit are electrically connected to each other. In other words, the one of the source electrode and the drain electrode of the transistor 101 in the K-th stage unit boosting circuit is connected to a node N1_(K−1) in the (K−1)th stage unit boosting circuit.

In a (2M−1)th stage unit boosting circuit (M is a natural number which satisfies $1 \leq M \leq n/2$, hare, n is a natural number and an even number), the other electrode of the capacitor 106 is electrically connected to a clock signal line 121. In a 2M-th stage unit boosting circuit (M is a natural which satisfies $1 \leq M \leq n/2$), the other electrode of the capacitor 106 is electrically connected to a clock signal line 122.

Here, a clock signal CLK is input to the clock signal line 121 and a clock signal CLKB is input to the clock signal line 122. Needless to say, the clock signal CLKB can be input to the clock signal line 121 and the clock signal CLK can be input to the clock signal line 122. The clock signal CLK and the clock signal CLKB have opposite phases. For example, when the clock signal CLK is a high-level signal, the clock signal CLKB is a low-level signal. As the clock signal CLKB, for example, an inverted signal of the clock signal CLK can be used. The clock signal CLKB can be generated by inversion of the potential state of the clock signal CLK with a NOT circuit such as an inverter, for example. In the clock signal CLK and the clock signal CLKB, levels of a potential such as high level and low level can be determined as appropriate. Alternatively, the clock signal CLK can be generated with use of a buffer circuit and an oscillator circuit such as a ring oscillator, for example. The clock signal is not limited to the clock signal CLK and the clock signal CLKB, and three or more kinds of clock signals can be used.

Note that FIG. 1 illustrates the boosting circuit in the case where the number of stages n is an even number. In the case where the number of stages n of the boosting circuit is an odd number, the connection between the clock signal line 121 and a (n−1)th stage unit boosting circuit and the connection between the clock signal line 122 and the n-th stage unit boosting circuit illustrated in FIG. 1 are exchanged for a connection between the clock signal line 121 and the n-th stage unit boosting circuit and a connection between the clock signal line 122 and the (n−1)th stage unit boosting circuit.

In a first stage unit boosting circuit (i.e., a unit boosting circuit 111_1), the one of the source electrode and the drain electrode of the transistor 101 functions as an input terminal IN to which a signal IN is input. The potential value of the signal IN can be set as appropriate.

In the n-th stage unit boosting circuit (i.e., a unit boosting circuit 111_n), the other of the source electrode and the drain electrode of the transistor 101 functions as an output terminal OUT from which a signal OUT that is obtained by boosting the signal IN is output.

The other of the source electrode and the drain electrode of the transistor 101 in the unit boosting circuit 111_n is electrically connected to one electrode of a capacitor 120. A potential Vc1 is applied to the other electrode of the capacitor 120. The potential Vc1 may be any potential. For example, the same potential as a high-level potential $V_H$ or a low-level potential $V_L$ may be employed. The capacitance of the capacitor 120 is preferably larger than that of the capacitor 102 in the unit boosting circuit. Thus, the potential state of an output signal that is output from the output terminal OUT (i.e., a signal OUT that is an output signal of the boosting circuit) can be stabilized.

Note that the circuit configuration of the boosting circuit according to one embodiment of the disclosed invention is not limited to the structure illustrated in the circuit diagram of FIG. 1. For example, the circuit configuration of the boosting circuit illustrated in FIG. 2 may be employed.

Figure 2:
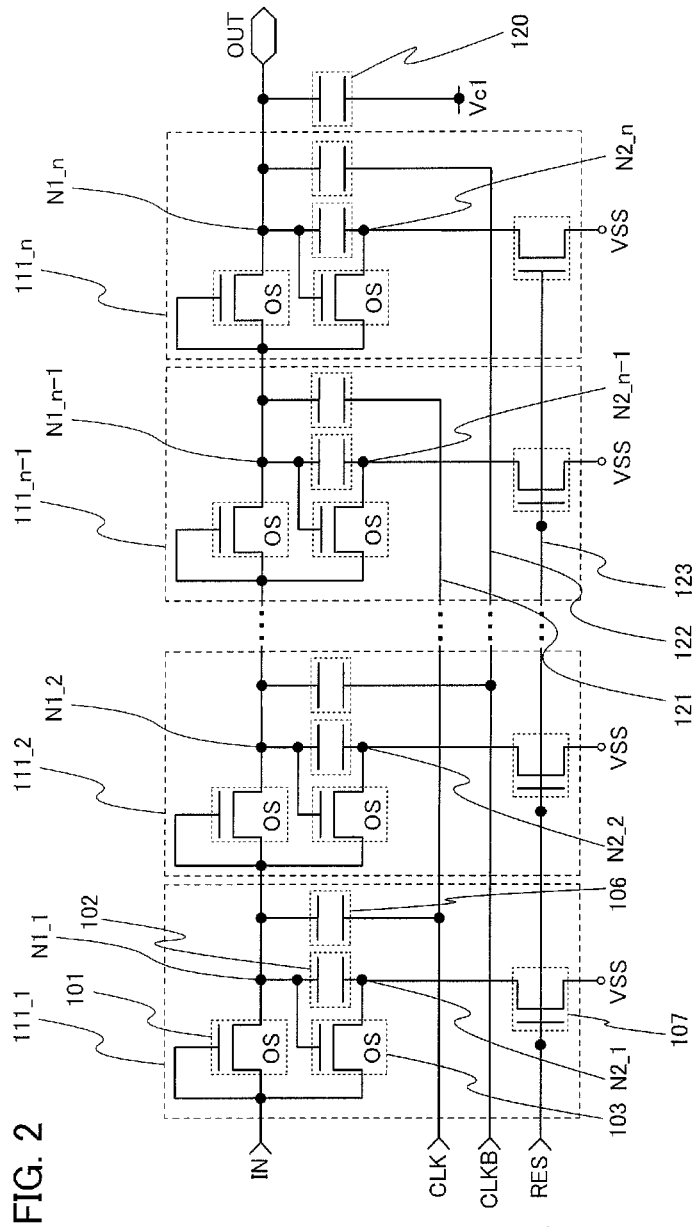
FIG. 2 is a circuit diagram of a boosting circuit according to one embodiment of the disclosed invention.

One of the differences between the boosting circuit illustrated in FIG. 2 and the boosting circuit illustrated in FIG. 1 is that whether unit boosting circuits 111_1 to 111_n each have a transistor 107 or not. One of a source electrode and a drain electrode of the transistor 107 is electrically connected to the other of the source electrode and the drain electrode of the transistor 103 and the other electrode of the capacitor 102. The other of the source electrode and the drain electrode of the transistor 107 is electrically connected to a low-potential power supply VSS. A gate electrode of the transistor 107 is electrically connected to a reset signal line 123.

A reset signal RES is input to the reset signal line 123. The potential value of the reset signal RES can be set as appropriate as long as the transistor 107 is brought into conduction by input of the reset signal RES.

The potential of the low-potential power supply VSS is lower than the potential of the signal IN.

As described above, each unit boosting circuit in the boosting circuit according to one embodiment of the disclosed invention includes the transistor 101 and the capacitor 102, which are included in each unit boosting circuit in the conventional boosting circuit, and further includes the transistor 103 and the capacitor 106. In addition to the conventional boosting of the node N1_m by inversion of a clock signal, such a bootstrap operation of the transistor 103 and the capacitor 102 can boost the node N1_m; thus, the boosting efficiency of the boosting circuit can be enhanced.

It is preferable that the transistor 101 and the transistor 103 be formed using a material which can make an off-state current sufficiently small, for example, an oxide semiconductor. Accordingly, a decrease in the potential of the node N1_m caused by leakage current in a non-conduction state of the transistor 101 and the transistor 103 can be suppressed. Therefore, in the above bootstrap operation, the potential of the node N1_m can be kept for a long time, so that the boosting efficiency of the boosting circuit can be enhanced.

<Circuit Operation>

Next, an example of operation of the boosting circuits illustrated in FIG. 1 and FIG. 2 will be described with reference to a timing chart of FIG. 3.

The operation of the boosting circuits illustrated in FIG. 1 and FIG. 2 can be explained by dividing the operation into operations corresponding to a plurality of periods in accordance with the clock signal CLK and the clock signal CLKB. In this embodiment, as an example of operation of the boosting circuit, changes in potentials of the node N1_1, a node N2_1, a node N1_2, and a node N2_2 in a first period to a third period which are set depending on change in the clock signal CLK will be described with reference to the timing chart of FIG. 3.

Note that an example of operation of the boosting circuits illustrated in FIG. 1 and FIG. 2 in the following conditions will be described in this embodiment: a high-level signal (potential $V_H$) is input as the signal IN; the clock signal CLK serves as a clock signal that periodically oscillates between a high level (potential $V_H$) and a low level (potential $V_L \approx 0V$); the clock signal CLKB serves as an inverted clock signal of the clock signal CLK; the potential of low-potential power supply VSS is potential $V_L$; the transistor 101 and the transistor 103 in each unit boosting circuit are n-channel transistors; the threshold potentials (potentials $V_{th}$) of the transistor 101 and the transistor 103 in each unit boosting circuit are the same; and the initial potentials of the node N1_m and the node N2_m each are $V_L$.

Figure 3:
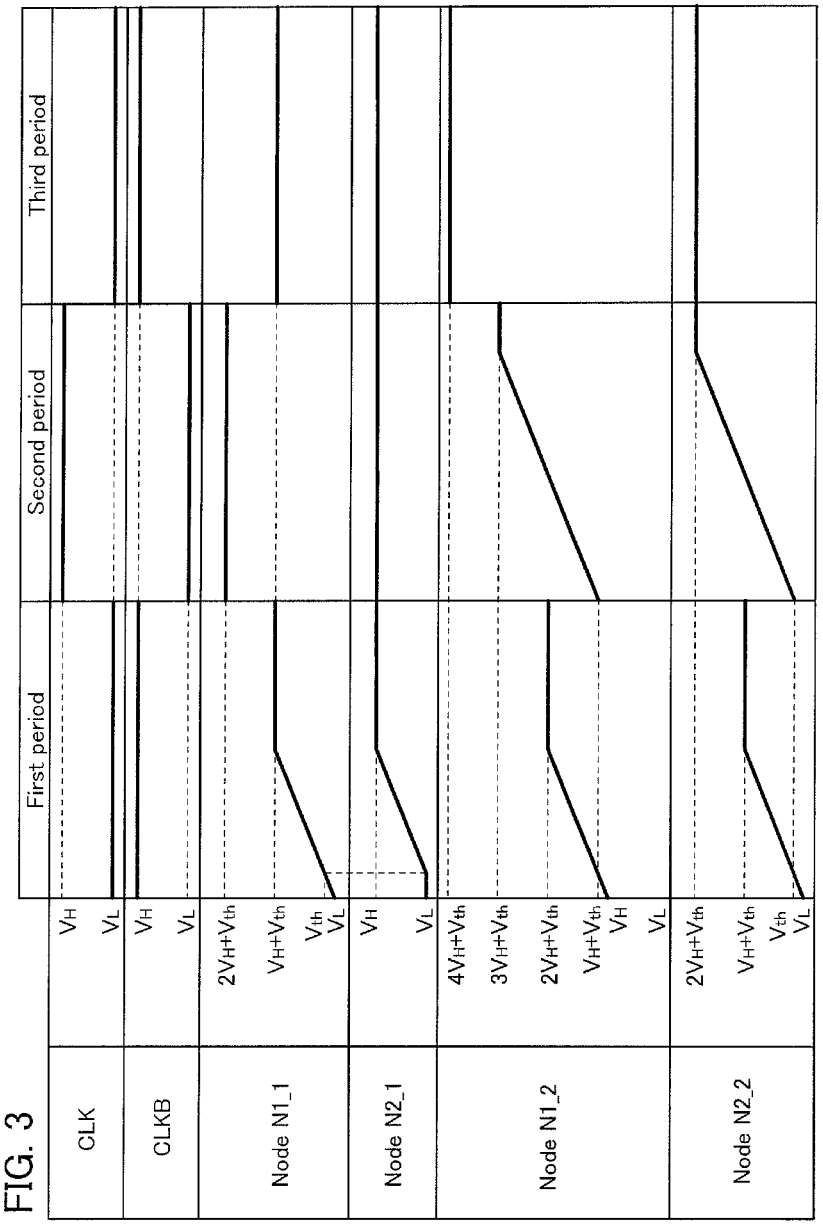
FIG. 3 is a timing chart showing operation of a boosting circuit according to one embodiment of the disclosed invention.

The timing chart of FIG. 3 shows an example of ideal operation of the boosting circuits illustrated in FIG. 1 and FIG. 2, and the boosting circuits illustrated in FIG. 1 and FIG. 2 do not necessarily operate as in the timing chart of FIG. 3. For example, a load, capacity, and noise in the circuit might cause a difference from operation illustrated in FIG. 3 in some cases.

Note that in the case where the boosting circuit illustrated in FIG. 2 is employed, the reset signal RES is input before the signal IN is input so that the transistor 107 in a unit boosting circuit 111_m is brought into conduction; thus the potential of the node N2_m can be decreased to the same potential (potential $V_L$) as that of the low-potential power supply VSS. Accordingly, when bootstrap operation is performed with use of the transistor 103 and the capacitor 102, the potential of the node N1_m can be certainly increased.

First, the signal IN (potential $V_H$) is input to the input terminal IN of the unit boosting circuit 111_1, and the first period starts. In the first period, the clock signal CLK is set to low level and the clock signal CLKB is set to high level (see FIG. 3).

When the signal IN is input to the unit boosting circuit 111_1, the potential $V_H$ is applied to the gate electrode of the transistor 101, so that the transistor 101 is brought into conduction and the potential of the node N1_1 is increased.

In the transistor 103 in the unit boosting circuit 111_1, when the difference between the potential of the node N1_1 (i.e., the potential of the gate electrode of the transistor 103) and the potential of the node N2_1 is larger than the threshold potential $V_{th}$ of the transistor 103, the transistor 103 is brought into conduction and the potential of the node N2_1 is increased. Here, as the potential of the node N2_1 (i.e., the potential of the other electrode of the capacitor 102) is increased, the potential of the one electrode of the capacitor 102 (i.e., the potential of the node N1_1) is increased by capacitive coupling. Accordingly, the potential of the gate electrode of the transistor 103 is sufficiently increased and thus the potential of the node N2_1 becomes $V_H$. The potential of the node N1_1 is increased from the potential $V_{th}$ as the reference by the same magnitude as that of the node N2_1, so that the potential of the node N1_1 becomes ($V_H + V_{th}$). Such operation in which the potentials of the node N1_1 and the node N2_1 are increased by capacitive coupling of the transistor 103 and the capacitor 102 is called bootstrap operation. Note that when the potential of the node N2_1 becomes $V_H$, the transistor 103 is brought out of conduction and the node N2_1 is brought into a floating state. Further, when the potential of the node N1_1 becomes $(V_H-V_{th})$, the transistor 101 is brought out of conduction.

On the other hand, in the unit boosting circuit 111_2 in the first period, the potential of the other electrode of the capacitor 106 which is electrically connected to the clock signal line 122 changes from $V_L$ to $V_H$, and the potential of the node N1_2 is also increased by approximately the potential difference $V_H$ by capacitive coupling of the capacitor 106. In such a manner, the potential of the node N1_2 is increased to approximately $V_H$. Accordingly, when the difference between the potential of the node N1_2 (i.e., the potential of the gate electrode of the transistor 103) and the potential of the node N2_2 is larger than the threshold potential $V_{th}$ of the transistor 103; thus, the transistor 103 is brought into conduction.

Accordingly, as the potential of the node N1_1 is increased, the potential of the node N2_2 is increased. As the potential of the node N2_2 (i.e., the potential of the other electrode of the capacitor 102) is increased, the potential of the one electrode of the capacitor 102 (i.e., the potential of the node N1_2) is increased by capacitive coupling. Thus, the potential of the gate electrode of the transistor 103 is sufficiently increased and the node N2_2 has the same potential as that of the node N1_1, so that the potential of the node N2_2 becomes $(V_H+V_{th})$. The potential of the node N1_2 is increased from the potential $V_H$ as the reference by the same magnitude as that of the node N2_2, so that the potential of the node N1_2 becomes $(2V_H+V_{th})$. Note that when the potential of the node N2_2 becomes $(V_H+V_{th})$, the transistor 103 is brought out of conduction and the node N2_2 is brought into a floating state. Further, when the potential of the node N1_2 becomes $V_H$, the transistor 101 is brought out of conduction. Note that in the first period, the potential of the node N1_2 is higher than $V_H$, so that the transistor 101 is brought out of conduction.

In the unit boosting circuit 111_1, by bootstrap operation of the transistor 103 and the capacitor 102, the potential of the node N1_1 can be increased before boosting of the potential of the node N1_1 by inversion of the clock signal which is performed later. Thus, the boosting efficiency of the boosting circuit can be enhanced.

When the transistor 101 and the transistor 103 are formed using a material which can make an off-state current sufficiently small, for example, an oxide semiconductor, a decrease in the potential of the node N1_m caused by leakage current in a non-conduction state of the transistor 101 and the transistor 103 can be suppressed. Therefore, in the above bootstrap operation, the boosting efficiency of the boosting circuit can be further enhanced.

Next, the clock signal CLK and the clock signal CLKB are inverted and the second period starts. In other words, in the second period, the clock signal CLK is set to high level and the clock signal CLKB is set to low level (see FIG. 3).

In the second period, the potential of the other electrode of the capacitor 106 in the unit boosting circuit 111_1 changes from $V_L$ to $V_H$, and the potential of the node N1_1 is increased by approximately the potential difference $V_H$ by capacitive coupling of the capacitor 106. In such a manner, the potential of the node N1_1 is increased to approximately $(2V_H+V_{th})$. Note that although the potential of the node N2_1 is also increased by capacitive coupling of the capacitor 102, this increase brings the transistor 103 into conduction and the potential of the node N2_1 returns to the potential $V_H$ soon.

When the transistor 101 is formed using a material which can make an off-state current sufficiently small, for example, an oxide semiconductor, a decrease in the potential of the node N1_1 caused by leakage current in a non-conduction state of the transistor 101 can be suppressed. Therefore, the potential of the node N1_1 can be kept for a long time, so that the boosting efficiency of the boosting circuit can be enhanced.

In the unit boosting circuit 111_2, the potential of the other electrode of the capacitor 106 changes from $V_H$ to $V_L$, and the potential of the node N1_2 is decreased by approximately the potential difference $V_H$ by capacitive coupling of a capacitor 106. In such a manner, the potential of the node N1_2 is decreased to approximately $(V_H+V_{th})$. At this time, the potential of the node N2_2 is also decreased by capacitive coupling of the capacitor 102, so that the potential of the node N2_2 is decreased to approximately $V_{th}$.

At this time, the transistor 101 and the transistor 103 in the unit boosting circuit 111_2 are brought into conduction, so that the potential $(2V_H+V_{th})$ of the node N1_1 is supplied to the node N1_2 and the node N2_2 and the potentials of the node N1_2 and the node N2_2 are increased. As the potential of the node N2_2 (i.e., the potential of the other electrode of the capacitor 102) is increased, the potential of the one electrode of the capacitor 102 (i.e., the potential of the node N1_2) is increased by capacitive coupling. Thus, the potential of the gate electrode of the transistor 103 is sufficiently increased, so that the potential of the node N2_2 becomes $(2V_H+V_{th})$. The potential of the node N1_2 is increased from the potential $(V_H+V_{th})$ as the reference by the same magnitude as that of the node N2_2, so that the potential of the node N1_2 becomes $(3V_H+V_{th})$ at a maximum. Note that when the potential of the node N2_2 becomes $(2V_H+V_{th})$, the transistor 103 is brought out of conduction and the node N2_2 is brought into a floating state. Further, when the potential of the node N1_2 is set to $2V_H$, the transistor 101 is brought out of conduction.

In the unit boosting circuit 111_2, by bootstrap operation of the transistor 103 and the capacitor 102, the potential of the node N1_2 can be increased before boosting of the potential of the node N1_2 by inversion of the clock signal which is performed later. Thus, the boosting efficiency of the boosting circuit can be enhanced.

When the transistor 101 and the transistor 103 are formed using a material which can make an off-state current sufficiently small, for example, an oxide semiconductor, a decrease in the potential of the node N1_m caused by leakage current in a non-conduction state of the transistor 101 and the transistor 103 can be suppressed. Therefore, in the above bootstrap operation, the boosting efficiency of the boosting circuit can be further enhanced.

Next, the clock signal CLK and the clock signal CLKB are inverted again and the third period starts. In other words, in the third period, the clock signal CLK is set to low level and the clock signal CLKB is set to high level (see FIG. 3).

In the third period, the potential of the other electrode of the capacitor 106 in the unit boosting circuit 111_2 changes from $V_L$ to $V_H$, and the potential of the node N1_2 is also increased by approximately the potential difference $V_H$ by capacitive coupling of the capacitor 106. In such a manner, the potential of the node N1_2 is increased to approximately $(4V_H+V_{th})$. Note that although the potential of the node N2_2 is also increased by capacitive coupling of the capacitor 102, this increase brings the transistor 103 into conduction and the potential of the node N2_2 returns to the potential $(2V_H+V_{th})$ soon.

Thus, also in the unit boosting circuit 111_3, the potential of the node N1_3 is increased in a manner similar to that of the unit boosting circuits 111_1 and 111_2. The potential of the node N1_3 is further increased by bootstrap operation of the transistor 103 and the capacitor 102.

In each of the third and subsequent stage unit boosting circuits, operations which are similar to those of the previous stage unit boosting circuits are sequentially performed in accordance with a periodical change of the clock signal CLK or the clock signal CLKB which periodically oscillates between a high level and a low level, so that the potential of the node N1_m is higher as the number of stages in is larger. The signal OUT that is output from the output terminal OUT is boosted in every unit boosting circuit in which a potential is boosted with the periodically change of the clock signal CLK or the clock signal CLKB between a high level and a low level, so that the potential of the signal OUT is obtained by boosting the signal IN depending on the number of stages. In such a manner, in the boosting circuits illustrated in FIG. 1 and FIG. 2, the potential of the signal IN is boosted and the signal OUT having the boosted potential is output as an output signal.

Note that in the third period, although the potential of the node N1_1 in the unit boosting circuit 111_1 is decreased by capacitive coupling of the capacitor 106 and the capacitor 102 in accordance with change in potential of the other electrode of the capacitor 106 from $V_H$ to $V_L$, the potential of the node N1_1 is increased to the previous potential when the clock signal CLK is inverted next. After that, the potential of the node N1_1 is increased or decreased in accordance with inversion of the clock signal CLK. This can be applied to the second stage and subsequent stage unit boosting circuits.

As described above, when the boosting circuit according to one embodiment of the disclosed invention is employed, in addition to the conventional boosting of the node N1_m by inversion of a clock signal, the node N1_m can be boosted by bootstrap operation of the transistor 103 and the capacitor 102; thus, the boosting efficiency of the boosting circuit can be enhanced.

When the transistor 101 and the transistor 103 are formed using a material which can make an off-state current sufficiently small, for example, an oxide semiconductor, a decrease in the potential of the node N1_m caused by leakage current in a non-conduction state of the transistor 101 and the transistor 103 can be suppressed. Therefore, in the above bootstrap operation, the boosting efficiency of the boosting circuit can be further enhanced.

Further, since the boosting efficiency in each unit boosting circuit is enhanced as described above, while the number of unit boosting circuits can be reduced, the boosting effect that is nearly equal to that of the conventional boosting circuit can be obtained. Thus, high integration can be achieved by reduction in the layout area of the boosting circuit.

As described above, in an example of the boosting circuit according to this embodiment, boosting operation is performed in each unit boosting circuit, so that a signal whose potential is higher than the potential of an input signal can be output as an output signal.

The structures, methods, and the like described in this embodiment can be combined as appropriate with any of the structures, methods, and the like described in the other embodiments.

Embodiment 2

In this embodiment, a boosting circuit which differs from the boosting circuit described in Embodiment 1 will be described with reference to FIG. 4 and FIG. 5. Note that in a circuit diagram, "OS" may be written beside a transistor in order to indicate that the transistor includes an oxide semiconductor.

<Circuit Configuration>

An example of a circuit configuration of a boosting circuit according to one embodiment of the disclosed invention will be described with reference to a circuit diagram of FIG. 4.

Figure 4:
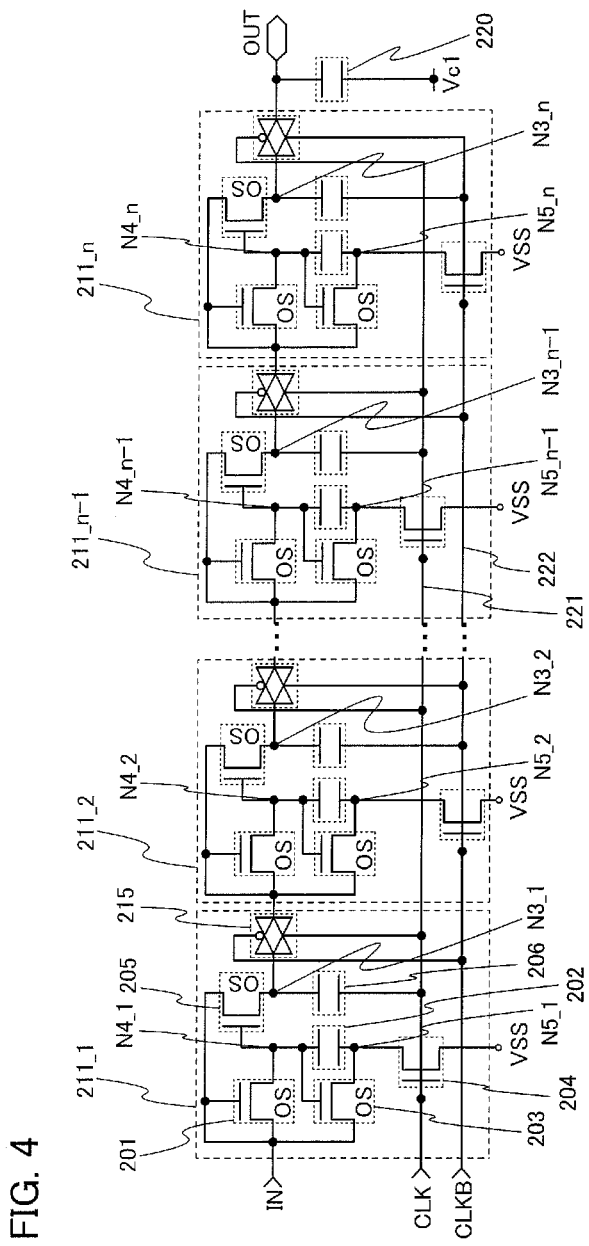
FIG. 4 is a circuit diagram of a boosting circuit according to one embodiment of the disclosed invention.

A boosting circuit illustrated in FIG. 4 is formed with n stages of unit boosting circuits 211_1 to 211_n (n is a natural number) which are electrically connected to each other in series. Here, a unit boosting circuit forms one stage of the boosting circuit.

Each of unit boosting circuits 211_1 to 211_n includes a transistor 201, a capacitor 202, a transistor 203, a transistor 204, a transistor 205, a capacitor 206, and an analog switch 215 including first to fourth terminals. Note that in the case where the electrostatic capacitance of a gate insulating layer of the transistor 203 is large, the capacitor 202 may be omitted because the transistor 203 can also function as the capacitor 202.

Each of the unit boosting circuits 211_1 to 211_n has the following structure: a gate electrode of the transistor 201, one of a source electrode and a drain electrode of the transistor 201, one of a source electrode and a drain electrode of the transistor 203, and one of a source electrode and a drain electrode of the transistor 205 are electrically connected to one another; the other of the source electrode and the drain electrode of the transistor 201, a gate electrode of the transistor 203, one electrode of the capacitor 202, and a gate electrode of the transistor 205 are electrically connected to one another; and the other of the source electrode and the drain electrode of the transistor 203, the other electrode of the capacitor 202, and one of a source electrode and a drain electrode of the transistor 204 are electrically connected to one another. Further, the other of the source electrode and the drain electrode of the transistor 205, one electrode of the capacitor 206, and a first terminal of the analog switch 215 are electrically connected to one another. The other of the source electrode and the drain electrode of the transistor 204 and the low-potential power supply VSS are electrically connected to each other Note that the one electrode of the capacitor 206 is not necessarily electrically connected to the other of the source electrode and the drain electrode of the transistor 205 and the first terminal of the analog switch 215, and the one electrode of the capacitor 206 may be electrically connected to a fourth terminal of the analog switch 215.

In an m-th stage unit boosting circuit (in is a natural number which satisfies 1≤M≤n), a portion where the other of the source electrode and the drain electrode of the transistor 205, the one electrode of the capacitor 206, and the first terminal of the analog switch 215 are connected is called a node N3_m. In the m-th stage unit boosting circuit, a portion where the other of the source electrode and the drain electrode of the transistor 201, the gate electrode of the transistor 203, the one electrode of the capacitor 202, and the gate electrode of the transistor 205 are connected is called a node N4_m. Further, in the m-th stage unit boosting circuit, a portion where the other of the source electrode and the drain electrode of the transistor 203, the other electrode of the capacitor 202, and the one electrode of the source electrode and the drain electrode of the transistor 204 are connected is called a node N5_m.

The one of the source electrode and the drain electrode of the transistor 201 in a K-th stage unit boosting circuit (K is a natural number which satisfies 2≤K≤n) and the fourth terminal of the analog switch 215 in a (K−1)th stage unit boosting circuit are electrically connected to each other. In other words, the one of the source electrode and the drain electrode of the transistor 201 in the K-th stage unit boosting circuit is connected to a node N3_(K−1) in the (K−1)th stage unit boosting circuit through the analog switch 215.

Further, in a (2M−1)th stage unit boosting circuit (M is a natural number which satisfies 1≤M≤n/2, here, n is a natural number and an even number), a gate electrode of the transistor 204 and the other electrode of the capacitor 206 are electrically connected to a clock signal line 221. In the 2M-th stage unit boosting circuit (M is a natural number which satisfies 1≤M≤n/2), the gate electrode of the transistor 204 and the other electrode of the capacitor 206 are electrically connected to a clock signal line 222. Further, in the (2M−1)th stage unit boosting circuit (M is a natural number which satisfies 1≤M≤n/2), a second terminal of the analog switch 215 is electrically connected to the clock signal line 221, and a third terminal of the analog switch 215 is electrically connected to the clock signal line 222. Further, in the 2M-th stage unit boosting circuit (M is a natural number which satisfies 1≤M≤n/2), the second terminal of the analog, switch 215 is electrically connected to the clock signal line 222, and the third terminal of the analog switch 215 is electrically connected to the clock signal line 221.

Here, a clock signal CLK is input to the clock signal line 221 and a clock signal CLKB is input to the clock signal line 222. Needless to say, the clock signal CLKB can be input to the clock signal line 221 and the clock signal CLK can be input to the clock signal line 222. The clock signal CLK and the clock signal CLKB have opposite phases. For example, when the clock signal CLK is a high-level signal, the clock signal CLKB is a low-level signal. As the clock signal CLKB, for example, an inverted signal of the clock signal CLK can be used. The clock signal CLKB can be generated by inversion of the potential state of the clock signal CLK with a NOT circuit such as an inverter, for example. In the clock signal CLK and the clock signal CLKB, levels of a potential such as high level and low level can be determined as appropriate as long as the conduction state of the transistor 204 is switched by inversion of the clock signal CLK and the clock signal CLKB. Alternatively, the clock signal CLK can be generated with use of a buffer circuit and an oscillator circuit such as a ring oscillator, for example. The clock signal is not limited to the clock signal CLK and the clock signal CLKB, and three or more kinds of clock signals can be used.

Note that FIG. 4 illustrates the boosting circuit in the case where the number of stages n is an even number. In the case where the number of stages n of the boosting circuit is an odd number, the connection between the clock signal line 221 and a (n−1)th stage unit boosting circuit and the connection between the clock signal line 222 and the n-th stage unit boosting circuit illustrated in FIG. 4 are exchanged for a connection between the clock signal line 221 and the n-th stage unit boosting circuit and a connection between the clock signal line 222 and the (n−1)th stage unit boosting circuit.

The analog switch 215 is brought into conduction when a high-level signal is input to the second terminal and a low-level signal is input to the third terminal. The analog switch 215 is brought out of conduction when a low-level signal is input to the second terminal and a high-level signal is input to the third terminal.

The analog switch 215 can be manufactured by combining an n-channel transistor and a p-channel transistor. One of a source electrode and a drain electrode of the n-channel transistor and one of a source electrode and a drain electrode of the p-channel transistor are electrically connected to each other to function as the first terminal of the analog switch 215. A gate electrode of the n-channel transistor functions as the second terminal of the analog switch 215. A gate electrode of the p-channel transistor functions as the third terminal of the analog switch 215. The other of the source electrode and the drain electrode of the n-channel transistor and the other of the source electrode and the drain electrode of the p-channel transistor are electrically connected to each other to function as the fourth terminal of the analog switch 215. With use of the analog switch 215, the potential of the node N3_m which is boosted in each unit boosting circuit can be provided to the next stage unit boosting circuit without a decrease in the potential.

In the case where the transistor 201, the transistor 203, or the transistor 205 is formed using an oxide semiconductor, an n-channel transistor included in the analog switch 215 is also formed using an oxide semiconductor that is suitable for formation of an n-channel transistor; thus, simplification of the manufacturing process can be achieved.

In a first stage unit boosting circuit (i.e., a unit boosting circuit 211_1), one of the source electrode and the drain electrode of the transistor 201 functions as an input terminal IN to which a signal IN is input. The potential value of the signal IN can be set as appropriate.

Note that the potential of the low-potential power supply VSS is lower than the potential of the signal IN.

The fourth terminal of the analog switch 215 in the n-th stage unit boosting circuit (i.e., a unit boosting circuit 211_n) functions as the output terminal OUT and outputs the signal OUT that is obtained by boosting the signal IN.

The other of the source electrode and the drain electrode of the transistor 205 in the unit boosting circuit 211_n is electrically connected to one electrode of a capacitor 220 via the analog switch 215. A potential Vc1 is applied to the other electrode of the capacitor 220. The potential Vc1 may be any potential. For example, the same potential as a high-level potential $V_H$ or a low-level potential $V_L$ may be employed. The capacitance of the capacitor 220 is preferably larger than that of the capacitor 206 in the unit boosting circuit. Thus, the potential state of an output signal that is output from the output terminal OUT (i.e., a signal OUT that is an output signal of the boosting circuit) can be stabilized.

As described above, each unit boosting circuit in the boosting circuit according to one embodiment of the disclosed invention includes the transistor 205 and the capacitor 206, which are included in each unit boosting circuit in the conventional boosting circuit, and further includes the transistors 201 and 203 and the capacitor 202. In the structure of the conventional boosting circuit, the potential output to the node N3_m is decreased by the amount of threshold potential of the transistor 205 in each unit boosting circuit, so that the output potential loss corresponding to the threshold potential of the transistor 205 in each stage unit boosting circuit is added as the number of unit boosting circuits is increased. However, with use of the above structure, the potential of the node N4_m (i.e., the potential of the gate electrode of the transistor 205) can be higher than the potential of one of the source electrode and the drain electrode of the transistor 205 by bootstrap operation of the transistor 203 and the capacitor 202; thus, in each unit boosting circuit, potential can be output to the node N3_m without the loss corresponding to the threshold potential of the transistor 205. Therefore, the boosting efficiency of the boosting circuit can be enhanced.

When the transistors 201 and 203 are formed using a material which can make an off state current sufficiently small, for example, an oxide semiconductor, a decrease in the potential of the node N4_m caused by leakage current in a non-conduction state of the transistors 201 and 203 can be suppressed. Therefore, the boosting efficiency of the boosting circuit can be enhanced.

It is preferable that the transistor 205 be formed using a material which can make an off-state current sufficiently small, for example, an oxide semiconductor. With use of a transistor formed using an oxide semiconductor as the transistor 205, a decrease in the potential of the node N3_m caused by leakage current in a non-conduction state of the transistor 205 can be suppressed when the node N3_m is boosted by utilizing inversion of the clock signal and capacitive coupling of the capacitor 206. Therefore, the potential of the node N3_m can be kept for a long time, so that the boosting efficiency of the boosting circuit can be enhanced.
<Circuit Operation>

Next, an example of operation of the boosting circuit illustrated in FIG. 4 will be described with reference to a timing chart of FIG. 5.

The operation of the boosting circuit illustrated in FIG. 4 can be explained by dividing the operation into operations corresponding to a plurality of periods in accordance with the clock signal CLK and the clock signal CLKB. In this embodiment, as an example of operation of the boosting circuit, changes in potentials of the node N3_1, a node N3_2, a node N4_1, and a node N4_2 in the first period to the third period which are set depending on change in the clock signal CLK will be described with reference to the timing chart of FIG. 5.

Note that an example of operation of the boosting circuit illustrated in FIG. 4 in the following conditions will be described in this embodiment: a high-level signal (potential $V_H$) is input as the signal IN; the clock signal CLK serves as a clock signal that periodically oscillates between a high level (potential $V_H$) and a low level (potential $V_L \approx 0V$); the clock signal CLKB serves as an inverted clock signal of the clock signal CLK; the potential of low-potential power supply VSS is potential $V_L$; the transistor 201, the transistor 203, and the transistor 205 in each unit boosting circuit are n-channel transistors; the threshold potentials (potentials $V_{th}$) of the transistors 201, 203, and 205 in each unit boosting circuit are the same; and the initial potentials of the node N3_m, the node N4_m, and the node N5_m each are $V_L$.

Figure 5:
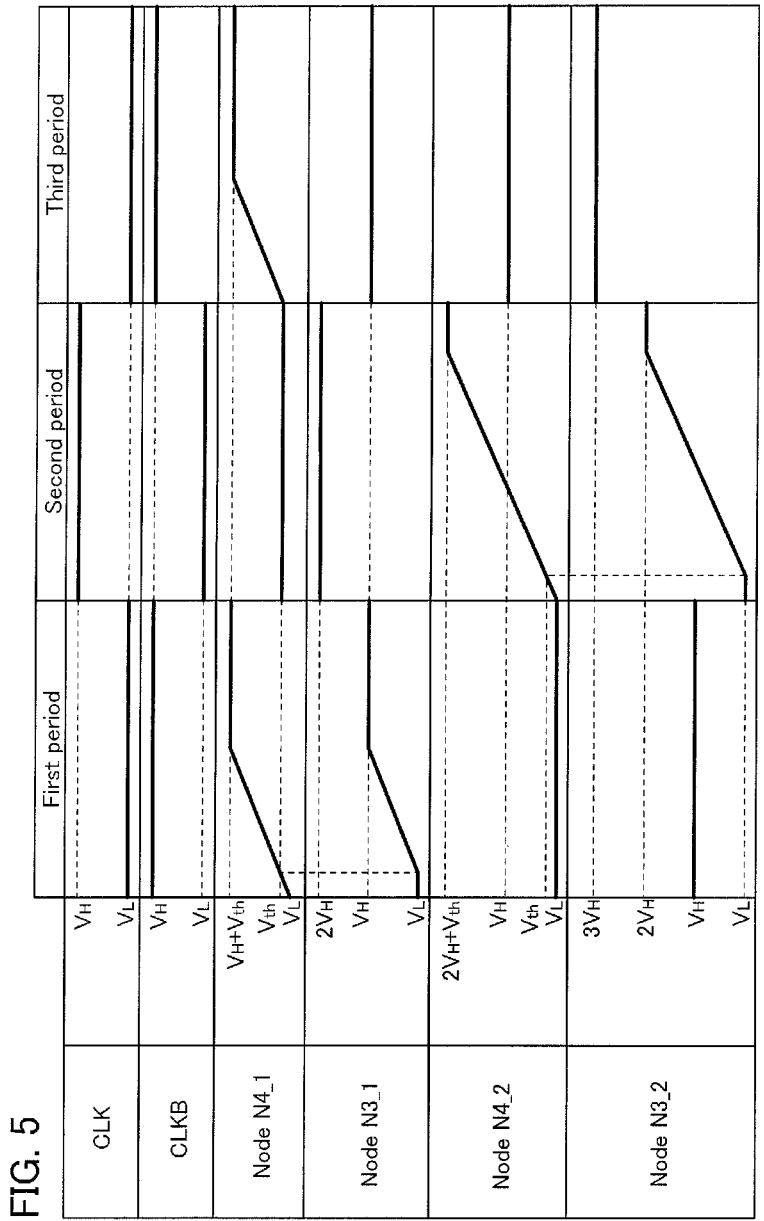
FIG. 5 is a timing chart showing operation of a boosting circuit according to one embodiment of the disclosed invention.

The timing chart of FIG. 5 shows an example of ideal operation of the boosting circuit illustrated in FIG. 4, and the boosting circuit illustrated in FIG. 4 does not necessarily operate as in the timing chart of FIG. 5. For example, a load, capacity, and noise in the circuit might cause a difference from operation illustrated in FIG. 5 in some cases.

First, the signal IN is input to the input terminal IN of the unit boosting circuit 211_1, and the first period starts. In the first period, the clock signal CLK is set to low level and the clock signal CLKB is set to high level (see FIG. 5). Accordingly, the analog switch 215 in the unit boosting circuit 211_1 is brought out of conduction.

When the signal IN is input to the unit boosting circuit 211_1, the potential $V_H$ is applied to the gate electrode of the transistor 201, so that the transistor 201 is brought into conduction and the potential of the node N4_1 is increased.

In the transistor 205 in the unit boosting circuit 211_1, when the difference between the potential of the node N4_1 (i.e., the potential of the gate electrode of the transistor 205) and the potential of the node N3_1 is larger than the threshold potential $V_{th}$ of the transistor 205, the transistor 205 is brought into conduction and the potential of the node N3_1 is increased.

In the transistor 203 in the unit boosting circuit 211_1, when the difference between the potential of the node N4_1 (i.e., the potential of the gate electrode of the transistor 203) and the potential of the node N5_1 is larger than the threshold potential $V_{th}$ of the transistor 203, the transistor 203 is brought into conduction and the potential of the node N5_1 is increased. Here, as the potential of the node N5_1, (i.e., the potential of the other electrode of the capacitor 202) is increased, the potential of one electrode of the capacitor 202 (i.e., the potential of the node N4_1) is increased by capacitive coupling. Accordingly, the potential of the gate electrode of the transistor 203 is sufficiently increased and thus the potential of the node N5_1 becomes $V_H$. The potential of the node N4_1 is increased from the potential $V_{th}$ as the reference by the same magnitude as that of the node N5_1, so that the potential of the node N4_1 becomes ($V_H+V_{th}$). Such operation in which the potentials of the node N4_1 and the node N5_1 are increased by capacitive coupling of the transistor 203 and the capacitor 202 is called bootstrap operation. Note that when the potential of the node N5_1 becomes $V_H$, the transistor 203 is brought out of conduction and the node N5_1 is brought into a floating state. Further, when the potential of the node N4_1 becomes ($V_H+V_{th}$), the transistor 201 is brought out of conduction and the node N4_1 is brought into a floating state.

At this time, the potential of the node N4_1 (i.e., the potential of the gate electrode of the transistor 205) can be higher than that of the one of the source electrode and the drain electrode of the transistor 205 by bootstrap operation of the transistor 203 and the capacitor 202.

In the transistor 205 in the unit boosting circuit 211_1, when the potential of the node N4_1 (i.e., the potential of the gate electrode of the transistor 205) starts to increase to ($V_H+V_{th}$), the potential of the node N3_1 increases to $V_H$. In this manner, output potential of the unit boosting circuit 211_1 can be output to the node N3_1 without the loss corresponding to the threshold potential of the transistor 205, so that the boosting efficiency of the boosting circuit can be enhanced. Note that when the potential of the node N3_1 becomes $V_H$, the transistor 205 is brought out of conduction. At this time, the analog switch 215 in the unit boosting circuit 211_1 is brought out of conduction, the node N3_1 is brought into a floating state.

In the first period, in the unit boosting circuit 211_2, the potential of the other electrode of the capacitor 206 changes from $V_L$ to $V_H$, and thus the potential of the node N3_2 is increased by approximately the potential difference $V_H$ by capacitive coupling of the capacitor 206. In such a manner, the potential of the node N3_2 is increased to approximately $V_H$. The potential $V_H$ is applied to the gate electrode of the transistor 204 in the unit boosting circuit 211_2, the transistor 204 is brought into conduction, and the other electrode of the capacitor 202 is set to $V_L$, so that the potential of the node N4_2 is kept at $V_L$.

Next, the clock signal CLK and the clock signal CLKB are inverted and the second period starts. In other words, in the second period, the clock signal CLK is set to high level and the clock signal CLKB is set to low level (see FIG. 5). Accordingly, the analog switch 215 in the unit boosting circuit 211_1 is brought into conduction and the analog switch 215 in the unit boosting circuit 211_2 is brought out of conduction.

In the second period, the potential of the other electrode of the capacitor 206 in the unit boosting circuit 211_1 changes from $V_L$ to $V_H$, and the potential of the node N3_1 is increased by approximately the potential difference $V_H$ by capacitive coupling of the capacitor 206. In such a manner, the potential of the node N3_1 is increased to approximately $2V_H$.

When the transistor 205 is formed using a material which can make an off-state current sufficiently small, for example, an oxide semiconductor, a decrease in the potential of the node N3_1 caused by leakage current in a non-conduction state of the transistor 205 can be suppressed. Therefore, the potential of the node N3_1 can be kept for a long time, so that the boosting efficiency of the boosting circuit can be enhanced.

In the second period, potential $V_H$ is applied to the gate electrode of the transistor 204 in the unit boosting circuit 211_1, and the transistor 204 is brought into conduction. Accordingly, the potential of the other electrode of the capacitor 202 (i.e., the potential of a node N5_1) changes from $V_H$ to $V_L$, and the potential of the node N4_1 in a floating state is decreased by approximately the potential difference $V_H$ by capacitive coupling of the capacitor 202. In such a manner, the potential of the node N4_1 is decreased to approximately $V_{th}$.

Accordingly, in the unit boosting circuit 211_1, the potential difference between the gate electrode of the transistor 205 and one of the source electrode and the drain electrode of the transistor 205 can be approximately the threshold potential of the transistor 205; thus, even when the potential of the node N3_1 is increased by capacitive coupling of the capacitor 206, the transistor 205 is brought into conduction and a decrease in the potential of the node N3_1 can be prevented.

The potential of the other electrode of the capacitor 206 in the unit boosting circuit 211_2 changes from $V_H$ to $V_L$, and the potential of the node N3_2 is decreased by approximately the potential difference $V_L$, by capacitive coupling of the capacitor 206. In such a manlier, the potential of the node N3_2 is decreased to approximately $V_L$. Further, potential $V_L$ is applied to the gate electrode of the transistor 204 in the unit boosting circuit 211_2 and the transistor 204 is brought out of conduction, so that the power supply potential VSS and the node N5_2 are not electrically connected to each other.

In the second period, the analog switch 215 in the unit boosting circuit 211_1 is brought into conduction; thus, in the unit boosting circuit 211_2, potential of approximately $2V_H$ is applied to the gate electrode of the transistor 201 and the transistor 201 is brought into conduction, so that the potential of the node N4_2 is increased as in the unit boosting circuit 211_1.

In the transistor 205 in the unit boosting circuit 211_2, when the difference between the potential of the node N4_2 (i.e., the potential of the gate electrode of the transistor 205) and the potential of the node N3_2 is larger than the threshold potential $V_{th}$ of the transistor 205, the transistor 205 is brought into conduction and the potential of the node N3_2 is increased.

As in the unit boosting circuit 211_1, in the transistor 203 in the unit boosting circuit 211_2, when the difference between the potential of the node N4_2 (i.e., the potential of the gate electrode of the transistor 203) and the potential of the node N5_2 is larger than the threshold potential $V_{th}$ of the transistor 203, the transistor 203 is brought into conduction, so that the potential of the node N5_2 is increased. At this time, as the potential of the node N5_2 (i.e., the potential of the other electrode of the capacitor 202) is increased, the potential of one electrode of the capacitor 202 (i.e., the potential of the node N4_2) is increased by capacitive coupling. Thus, the potential of the gate electrode of the transistor 203 is sufficiently increased, so that the node N5_2 becomes $2V_H$. The potential of the node N4_2 is increased from the potential $V_{th}$ as the reference by the same magnitude as that of the node N5_2, so that the potential of the node N4_2 becomes ($2V_H + V_{th}$). Note that when the potential of the node N5_2 becomes $2V_H$, the transistor 203 is brought out of conduction and node N5_2 is brought into a floating state. Further, when the potential of the node N4_2 becomes ($2V_H - V_{th}$), the transistor 201 is brought out of conduction and the node N4_2 is brought into a floating state.

At this time, the potential of the node N4_2 (i.e., the potential of the gate electrode of the transistor 205) can be higher than that of one of the source electrode and the drain electrode of the transistor 205 by such bootstrap operation of the transistor 203 and the capacitor 202.

In the transistor 205 in the unit boosting circuit 211_2, when the potential of the node N4_2 (i.e., the potential of the gate electrode of the transistor 205) starts to increase to ($2V_H + V_{th}$), the potential of the node N3_2 increases to $2V_H$. In this manner, output potential of the unit boosting circuit 211_2 can be output to the node N3_2 without the loss corresponding to the threshold potential of the transistor 205, so that the boosting efficiency of the boosting circuit can be enhanced. Note that when the potential of the node N3_2 becomes $2V_H$, the transistor 205 is brought out of conduction. At this time, the analog switch 215 in the unit boosting circuit 211_2 is brought out of conduction, the node N3_2 is brought into a floating state.

Next, the clock signal CLK and the clock signal CLKB are inverted again and the third period starts. In other words, in the third period, the clock signal CLK is set to low level and the clock signal CLKB is set to high level (see FIG. 5). Accordingly, the analog switch 215 in the unit boosting circuit 211_1 is brought out of conduction and the analog switch 215 in the unit boosting circuit 211_2 is brought into conduction.

In the third period, the potential of the other electrode of the capacitor 206 in the unit boosting circuit 211_2 changes from $V_L$ to $V_H$, and the potential of the node N3_2 is increased by approximately the potential difference $V_H$ by capacitive coupling of the capacitor 206. In such a manner, the potential of the node N3_2 is increased to approximately $3V_H$.

In the third period, potential $V_H$ is applied to the gate electrode of the transistor 204 in the unit boosting circuit 211_2, and the transistor 204 is brought into conduction. Accordingly, the potential of the other electrode of the capacitor 202 (i.e., the potential of a node N5_2) changes from $2V_H$ to $V_L$, and the potential of the node N4_2 in a floating state is decreased by approximately the potential difference $2V_H$ by capacitive coupling of the capacitor 202. In such a manner, the potential of the node N4_2 is decreased to approximately $V_{th}$.

Accordingly, in the unit boosting circuit 211_2, the potential difference between the gate electrode of the transistor 205 and the one of the source electrode and the drain electrode of the transistor 205 can be approximately the threshold potential of the transistor 205; thus, even when the potential of the node N3_2 is increased by capacitive coupling of the capacitor 206, the transistor 205 is brought into conduction and a decrease in the potential of the node N3_2 can be prevented.

As in the unit boosting circuits 211_1 and 211_2, the potential of the node N4_3 is increased in the unit boosting circuit 2113. Then, the potential of the gate electrode of the transistor 205 is higher than that of one of the source electrode and the drain electrode of the transistor 205 by bootstrap operation of the transistor 203 and the capacitor 202; thus, output potential of the unit boosting circuit 211_3 can be output to the node N3_3 without the loss corresponding to the threshold potential of the transistor 205.

In each of the third and subsequent stage unit boosting circuits, operations which are similar to those of the previous stage unit boosting circuits are sequentially performed in accordance with a periodical change of the clock signal CLK or the clock signal CLKB which periodically oscillates between a high level and a low level, so that the potential of the node N3_m is the potential $mV_H$ that is proportional to the number of stages m. The signal OUT that is output from the output terminal OUT is boosted in every unit boosting circuit in which a potential is boosted with the periodically change of the clock signal CLK or the clock signal CLKB between a high level and a low level, so that the potential $nV_H$ of the signal OUT is obtained by boosting the signal IN depending on the number of stages n. In such a manner, in the boosting circuit illustrated in FIG. 4, the potential of the signal IN is boosted and the signal OUT having the boosted potential is output as an output signal.

Note that in the third period, although the potential of the node N3_1 in the unit boosting circuit 211_1 is decreased by capacitive coupling of the capacitor 206 in accordance with change in potential of the other electrode of the capacitor 206 from $V_H$ to $V_L$, the potential of the node N3_1 is increased to the previous potential when the clock signal CLK is inverted next. After that, the potential of the node N3_1 is increased or decreased in accordance with inversion of the clock signal CLK. This can be applied to the node N3_m in the second stage and subsequent stage unit boosting circuits. In the third period, the potential of the node N4_1 in the unit boosting circuit 211_1 becomes approximately potential ($V_H+V_{th}$) in a manner similar to that of the First period. After that, the potential of the node N4_1 is increased or decreased in accordance with inversion of the clock signal CLK. This can be applied to the node N4_m in the second stage and subsequent stage unit boosting circuits.

As described above, in an example of the boosting circuit according to this embodiment, boosting operation is performed in each unit boosting circuit, so that a signal whose potential is higher than the potential of an input signal can be output as an output signal.

With use of the boosting circuit according to one embodiment of the disclosed invention, the potential of the node N4_m (i.e., the potential of the gate electrode of the transistor 205) can be higher than the potential of one of the source electrode and the drain electrode of the transistor 205 by bootstrap operation of the transistor 203 and the capacitor 202; thus, in each unit boosting circuit, potential can be output to the node N3_m without the loss corresponding to the threshold potential of the transistor 205. Therefore, the boosting efficiency of the boosting circuit can be enhanced.

When the transistors 201 and 203 are formed using a material which can make an off-state current sufficiently small, for example, an oxide semiconductor, a decrease in the potential of the node N4_m caused by leakage current in a non-conduction state of the transistors 201 and 203 can be suppressed. In the bootstrap operation, the potential of the node N4_m can be held for a longer time; thus, the boosting efficiency of the boosting circuit can be enhanced.

When the transistor 205 is formed using a material which can make an off-state current sufficiently small, for example, an oxide semiconductor, a decrease in the potential of the node N3_m caused by leakage current in a non-conduction state of the transistor 205 can be suppressed. Therefore, the potential of the node N3_m can be kept for a long time, so that the boosting efficiency of the boosting circuit can be enhanced.

Further, since the boosting efficiency in each unit boosting circuit is enhanced as described above, while the number of unit boosting circuits can be reduced, the boosting effect that is nearly equal to that of the conventional boosting circuit can be obtained. Thus, high integration can be achieved by reduction in the layout area of the boosting circuit.

The structures, methods, and the like described in this embodiment can be combined as appropriate with any of the structures, methods, and the like described in the other embodiments.

Embodiment 3

In this embodiment, an RFID tag that is an application example of the boosting circuits in the above embodiments will be described with reference to FIG. 6.

An RFID tag in this embodiment includes a memory circuit inside, stores information which is necessary for the memory circuit, and transmits and receives information to/from the outside by using contactless means, for example, wireless communication. With these characteristics, an RFID tag can be used for an individual authentication system in which an object or the like is recognized by reading the individual information, for example. In order that an RFID tag is used for such application, extremely high reliability is needed.

A structure of an RFID tag will be described with reference to FIG. 6. FIG. 6 is a block diagram illustrating the structure of the RFID tag.

Figure 6:
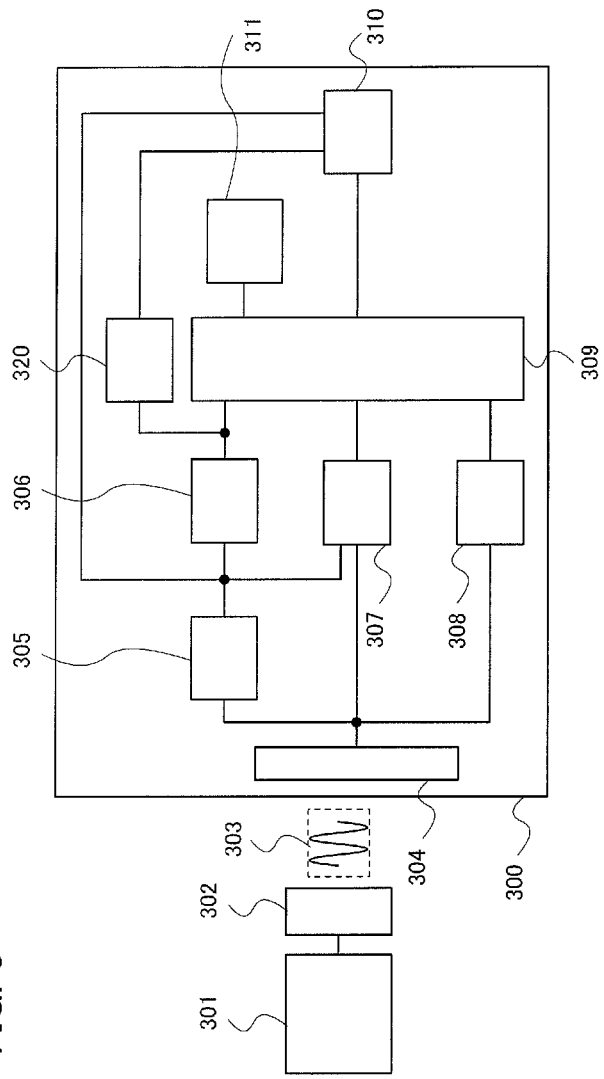
FIG. 6 is a block diagram of an RFID tag according to one embodiment of the disclosed invention.

As illustrated in FIG. 6, an RFID tag 300 includes an antenna 304 which receives a radio signal 303 transmitted from an antenna 302 connected to a communication device 301 (also referred to as an interrogator or a reader/writer). Further, the RFID tag 300 includes a rectifier circuit 305, a constant voltage circuit 306, a demodulation circuit 307, a modulation circuit 308, a logic circuit 309, a memory circuit 310, a ROM 311, and a boosting circuit 320. Note that data transmission methods are roughly classified into the following three methods: an electromagnetic coupling method by which a pair of coils is provided so as to be faced with each other and communicates with each other by mutual induction, an electromagnetic induction method by which communication is performed using an induction field, and an electric wave method by which communication is performed using an electric wave. The RFID tag 300 in this embodiment can be used for any one of these methods.

Next, a structure of each circuit will be described. The antenna 304 transmits and receives the radio signal 303 with the antenna 302 that is connected to the communication device 301. The rectifier circuit 305 generates an input potential by rectification, for example, half-wave voltage doubler rectification of an input alternating signal generated by reception of a radio signal at the antenna 304 and smoothing of the rectified signal with a capacitor element provided in a subsequent stage. Note that a limiter circuit may be provided on an input side or an output side of the rectifier circuit 305. The limiter circuit controls electric power so that electric power which is higher than or equal to certain electric power is not input to a circuit in a subsequent stage if the amplitude of the input alternating signal is high and an internal generation voltage is high.

The constant voltage circuit 306 generates a stable power supply voltage from an input potential and supplies it to each circuit. Note that the constant voltage circuit 306 may include a reset signal generation circuit inside. The reset signal generation circuit generates a reset signal of the logic circuit 309 by utilizing rise of the stable power supply voltage.

The demodulation circuit 307 demodulates the input alternating signal by envelope detection and generates a demodulated signal. The modulation circuit 308 performer modulation in accordance with data output from the antenna 304.

The logic circuit 309 analyzes and processes the demodulated signal. The memory circuit 310 stores information which is input and includes a row decoder, a column decoder, a memory region, and the like. Further, the ROM 311 stores an identification number (ID) or the like and outputs it in accordance with the processing.

The boosting circuit 320 boosts power supply voltage which is generated by the constant voltage circuit 306. It is preferable that power supply voltage which is generated by the constant voltage circuit 306 be boosted by the boosting circuit 320 and then supplied because the memory circuit 310 including a memory element needs a higher voltage than the logic circuit 309. Note that like the boosting circuits in the above embodiments, the boosting efficiency of the boosting circuit 320 is enhanced. Further, voltage that is boosted by the boosting circuit 320 may be supplied to the ROM 311.

Note that decision whether each circuit described above is provided or not can be made as appropriate as needed.

In this embodiment, the boosting circuit whose boosting efficiency is enhanced, which is described in the above embodiment, is mounted on the RFID tag 300. Therefore, a memory circuit including a memory element that needs a high voltage for operation, or the like can be mounted on the RFID tag easily.

The structures, methods, and the like described in this embodiment can be combined as appropriate with any of the structures, methods, and the like described in the other embodiments.

Embodiment 4

In this embodiment, an example of a transistor that can be applied to the boosting circuits described in the above embodiments will be described with reference to FIGS. 7A to 7D. There is no particular limitation on the structure of the transistor; for example, a staggered type or a planar type having a top-gate structure or a bottom-gate structure can be employed as appropriate. Further, the transistor may have a single-gate structure including one channel formation region, a double-gate structure including two channel formation regions, or a triple-gate structure including three channel formation regions. Alternatively, the transistor may have a dual-gate structure including two gate electrode layers positioned above and below a channel region with a gate insulating layer provided therebetween.

FIGS. 7A to 7D each illustrate an example of a cross-sectional structure of a transistor. Transistors illustrated in FIGS. 7A to 7D each include an oxide semiconductor as a semiconductor. An advantage of using an oxide semiconductor is that high mobility and low off-state current can be realized with a simple and low-temperature process.

Figure 7A:
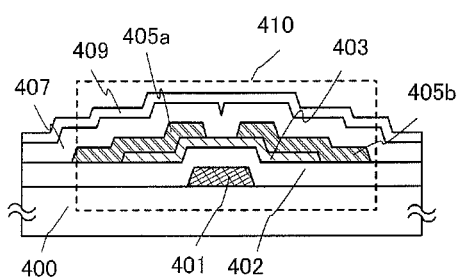
FIGS. 7A to 7D are each a cross-sectional view of a transistor according to one embodiment of the disclosed invention.

A transistor 410 illustrated in FIG. 7A is an example of bottom-gate transistors and is also referred to as an inverted staggered transistor.

The transistor 410 includes a gate electrode 401, a gate insulating layer 402, an oxide semiconductor layer 403, a source or drain electrode 405a, and a source or drain electrode 405b, over a substrate 400 having an insulating surface. An insulating layer 407 is provided to cover the transistor 410 and be in contact with the oxide semiconductor layer 403. A protective insulating layer 409 is formed over the insulating layer 407.

Figure 7B:
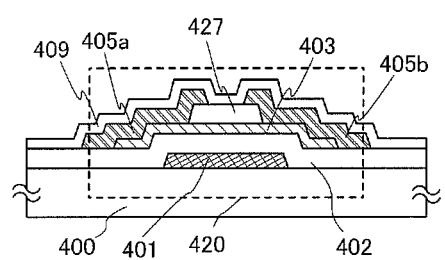

A transistor 420 illustrated in FIG. 7B is an example of bottom-gate transistors referred to as channel-protective type (also referred to as channel-stop type) and is also referred to as an inverted staggered transistor.

The transistor 420 includes the gate electrode 401, the gate insulating layer 402, the oxide semiconductor layer 403, an insulating layer 427 functioning as a channel protective layer, the source or drain electrode 405a, and the source or drain electrode 405b, over the substrate 400 having an insulating surface. The protective insulating layer 409 is provided to cover the transistor 420.

Figure 7C:
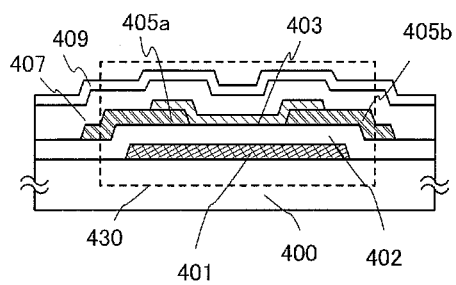

A transistor 430 illustrated in FIG. 7C is an example of bottom-gate transistors. The transistor 430 includes the gate electrode 401, the gate insulating layer 402, the source or drain electrode 405a, the source or drain electrode 405b, and the oxide semiconductor layer 403, over the substrate 400 having an insulating surface. The insulating layer 407 is provided to cover the transistor 430 and be in contact with the oxide semiconductor layer 403. The protective insulating layer 409 is formed over the insulating layer 407.

In the transistor 430, the gate insulating layer 402 is provided over and in contact with the substrate 400 and the gate electrode 401, and the source or drain electrode 405a and the source or drain electrode 405b are provided over and in contact with the gate insulating layer 402. The oxide semiconductor layer 403 is provided over the gate insulating layer 402, the source or drain electrode 405a, and the source or drain electrode 405b.

Figure 7D:
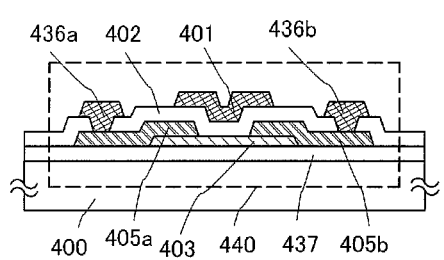

A transistor 440 illustrated in FIG. 7D is an example of top-gate transistors. The transistor 440 includes all insulating layer 437, the oxide semiconductor layer 403, the source or drain electrode 405a, the source or drain electrode 405b, the gate insulating layer 402, and the gate electrode 401, over the substrate 400 having an insulating surface. Further, a wiring 436a and a wiring 436b are provided to be in contact with the source or drain electrode 405a and the source or drain electrode 405b, respectively.

In this embodiment, as described above, the oxide semiconductor layer 403 is used as a semiconductor layer. As an oxide semiconductor used for the oxide semiconductor layer 403, the following can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, all Al—Zn—O-based oxide semiconductor, a Zn—Mg—O-based oxide semiconductor, a Sn—Mg—O-based oxide semiconductor, or an In—Mg—O-based oxide semiconductor, an In—Ga—O-based oxide semiconductor; or a single-component metal oxide such as an In—O-based oxide semiconductor, a Sn—O-based oxide semiconductor, or a Zn—O-based oxide semiconductor. Further, $SiO_2$ may be added to the above oxide semiconductor. Here, for example, an In—Ga—Zn—O-based oxide semiconductor is an oxide including at least In, Ga, and Zn, and there is no particular limitation on the composition ratio thereof. Further, the In—Ga—Zn—O-based oxide semiconductor may include an element other than In, Ga, and Zn.

For the oxide semiconductor layer 403, an oxide semiconductor represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, when a target used for forming the In—Zn—O-based oxide semiconductor has a composition ratio of In:Zn:O=x:y:z in an atomic ratio, Z>(1.5x+y).

In the transistors 410, 420, 430, and 440 each including the oxide semiconductor layer 403, leakage current can be sufficiently reduced. Thus, when any of these transistors is applied to a boosting circuit, potential can be held for a longer time and the boosting efficiency of the boosting circuit can be enhanced.

There is no particular limitation on a substrate that can be used as the substrate 400 having an insulating surface. For example, a glass substrate that is used for a liquid crystal display device or the like, a quartz substrate, or the like can be used. Alternatively, a substrate in which an insulating layer is formed over a silicon wafer, or the like may be used.

In the bottom-gate transistors 410, 420, and 430, an insulating layer serving as a base may be provided between the substrate and the gate electrode. The insulating layer has the function of preventing diffusion of an impurity element from the substrate, and can be formed of one or more films selected from a silicon nitride film, a silicon oxide film, a silicon nitride oxide film, and a silicon oxynitride film.

The gate electrode 401 can be formed using a metal material such as molybdenum, titanium, chromium, tantalum, tungsten, aluminum, copper, neodymium, or scandium, or an alloy material including any of these materials as its main component. The gate electrode 401 may have a single-layer structure or a layered structure.

The gate insulating layer 402 can be formed of one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and the like, by a plasma CVD method, a sputtering method, or the like. For example, a gate insulating layer with a total thickness greater than or equal to 55 nm and less than or equal to 500 nm can be formed in the following manner: a silicon nitride film ($SiN_y$ (y>0)) with a thickness greater than or equal to 50 nm and less than or equal to 200 nm is formed as a first gate insulating layer by a plasma CVD method; and a silicon oxide film ($SiO_x$ (x>0)) with a thickness greater than or equal to 5 nm and less than or equal to 300 inn is formed as a second gate insulating layer over the first gate insulating layer by a sputtering method. In this embodiment, the thickness of the gate insulating layer is 200 nm.

The source or drain electrode 405a and the source or drain electrode 405b can be formed using a metal material such as molybdenum, titanium, chromium, tantalum, tungsten, aluminum, copper, neodymium, or scandium, or an alloy material including any of these materials as its main component. For example, a metal layer such as a layer including aluminum or copper and a high-melting-point metal layer such as a layer including titanium, molybdenum, or tungsten can be stacked. An aluminum material to which an element (e.g., silicon, neodymium, or scandium) which prevents generation of a hillock or a whisker is added may be used so that heat resistance is improved.

A conductive metal oxide film may be used as a conductive film serving as the source or drain electrode 405a and the source or drain electrode 405b (including a wiring formed using the same layer as these electrodes). As conductive metal oxide, indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), an alloy of indium oxide and zinc oxide ($In_2O_3$—ZnO), or any of these metal oxide materials which contains silicon or silicon oxide can be used, for example.

The wiring 436a and the wiring 436b which are in contact with the source or drain electrode 405a and the source or drain electrode 405b can be formed with use of the same material as the source or drain electrode 405a and the source or drain electrode 405b.

As the insulating layers 407, 427, and 437, typically, an inorganic insulating film such as a silicon oxide film, a silicon oxynitride film, an aluminum oxide film, or an aluminum oxynitride film can be used.

As the protective insulating layer 409, an inorganic insulating film such as a silicon nitride film, an aluminum nitride film, a silicon nitride oxide film, or an aluminum nitride oxide film can be used.

In addition, a planarization insulating film may be formed over the protective insulating layer 409 in order to reduce surface unevenness due to the transistor. For the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed using these materials.

The structures, methods, and the like described in this embodiment can be combined as appropriate with any of the structures, methods, and the like described in the other embodiments.

Embodiment 5

In this embodiment, an example of a transistor including an oxide semiconductor layer and an example of a manufacturing method thereof will be described in detail with reference to FIGS. 8A to 8E.

FIGS. 8A to 8E are cross-sectional views illustrating a process for manufacturing a transistor. Note that a transistor 510 illustrated in FIGS. 8A to 8E is an inverted staggered transistor that is similar to the transistor 410 illustrated in FIG. 7A.

An oxide semiconductor used for a semiconductor layer in this embodiment is made to be an i-type (intrinsic) oxide semiconductor or made to be substantially i-type (intrinsic) oxide semiconductor by being highly purified by removing hydrogen, which is an n-type impurity, from an oxide semiconductor so that impurities that are not main components of the oxide semiconductor are contained as little as possible.

Note that a highly-purified oxide semiconductor includes extremely few carriers, and the carrier concentration thereof is lower than $1 \times 10^{14}/cm^3$, preferably lower than $1 \times 10^{12}/cm^3$, further preferably $1 \times 10^{11}/cm^3$. Further, since the number of carriers is small, current in an off state (off-state current) is sufficiently small.

Specifically, in a transistor including the above oxide semiconductor layer, the off-state current density per a channel width of 1 μm at room temperature (25° C.) can be less than or equal to 100 zA/μm ($1 \times 10^{-19}$ A/μm), further, less than or equal to 10 zA/μm ($1 \times 10^{-20}$ A/μm).

In the transistor 510 including a highly-purified oxide semiconductor layer, the temperature dependence of on-state current is hardly observed, and off-state current remains extremely low at a high temperature.

Steps of manufacturing the transistor 510 over a substrate 505 will be described below with reference to FIGS. 8A to 8E.

First, a conductive film is formed over the substrate 505 having an insulating surface, and then, a gate electrode 511 is formed through a first photolithography process. Note that a resist mask used for the photolithography process may be formed by an inkjet method. Formation of the resist mask by an inkjet method needs no photomask; thus, the manufacturing cost can be reduced.

As the substrate 505 having an insulating surface, a substrate similar to the substrate 400 described in the above embodiment can be used. In this embodiment, a glass substrate is used as the substrate 505.

Note that an insulating layer serving as a base may be provided between the substrate 505 and the gate electrode 511. The insulating layer has the function of preventing diffusion of an impurity element from the substrate 505, and can be formed of one or more films selected from a silicon nitride film, a silicon oxide film, a silicon nitride oxide film, a silicon oxynitride film, and the like.

The gate electrode 511 can be formed using a metal material such as molybdenum, titanium, chromium, tantalum, tungsten, aluminum, copper, neodymium, or scandium, or an alloy material including any of these materials as its main component. The gate electrode 511 may have a single-layer structure or a layered structure.

Next, a gate insulating layer 507 is formed over the gate electrode 511. The gate insulating layer 507 can be formed by a plasma CVD method, a sputtering method, or the like. The gate insulating layer 507 can be formed of one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and the like.

In order that hydrogen, a hydroxyl group, and moisture might be contained in the gate insulating layer 507 and an oxide semiconductor film 530 as little as possible, it is preferable that the substrate 505 over which the gate electrode 511 is formed or the substrate 505 over which components up to and including the gate insulating layer 507 are formed be preheated in a preheating chamber of a sputtering apparatus as pretreatment for formation of the oxide semiconductor film 530 so that impurities such as hydrogen and moisture adsorbed to the substrate 505 are eliminated. As an evacuation means provided in the preheating chamber, a cryopump is preferable, Alternatively, this preheating step may be performed on the substrate 505 over which components up to and including a source or drain electrode 515a and a source or drain electrode 515b are formed. This step of preheating treatment can be omitted.

Figure 8A:
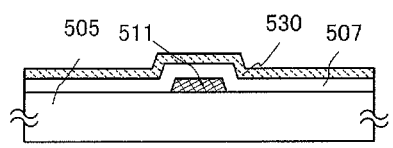
FIGS. 8A to 8E are cross-sectional views illustrating a manufacturing process of a transistor according to one embodiment of the disclosed invention.

Next, the oxide semiconductor film 530 with a thickness greater than or equal to 2 nm and less than or equal to 200 nm, preferably greater than or equal to 5 nm and less than or equal to 30 nm is formed over the gate insulating layer 507 (see FIG. 8A).

The oxide semiconductor film 530 can be formed using the four-component metal oxide, the three-component metal oxide, and the two-component metal oxide, the In—O-based oxide semiconductor, the Sn—O-based oxide semiconductor, or the Zn—O-based oxide semiconductor, which are described in the above embodiment.

As a target for forming the oxide semiconductor film 530 by a sputtering method, a target having a composition ratio of In:Ga:Zn=1:x:y (x is greater than or equal to 0 and y is greater than or equal to 0.5 and less than or equal to 5) is preferably used. For example, a target having a composition ratio of In:Ga:Zn=1:1:1 [atomic ratio] (x=1, y=1) (i.e., $In_2O_3$:$Ga_2O_3$:ZnO=1:1:2 [molar ratio]) can be used. Alternatively, a target having a composition ratio of In:Ga:Zn=1:1:0.5 [atomic ratio] (x=1, y=0.5) (i.e., $In_2O_3$:$Ga_2O_3$:ZnO=1:1:1 [molar ratio]), a target having a composition ratio of In:Ga:Zn=1:1:2 [atomic ratio] (x=1, y=2) (i.e., $In_2O_3$:$Ga_2O_3$:ZnO=1:1:4 [molar ratio]), or a target having a composition ratio of In:Ga:Zn=1:0:1 [atomic ratio] (x=0, y=1) (i.e., $In_2O_3$:$Ga_2O_3$:ZnO=1:0:2 [molar ratio]) can be used.

In this embodiment, an oxide semiconductor layer having an amorphous structure is formed by a sputtering method using an In—Ga—Zn—O-based metal oxide target.

The relative density of a metal oxide in a metal oxide target is greater than or equal to 80%, preferably greater than or equal to 95%, further preferably greater than or equal to 99.9%. The use of a metal oxide target with high relative density makes it possible to form an oxide semiconductor layer having a dense structure.

The atmosphere under which the oxide semiconductor film 530 is formed is preferably a rare gas (typically argon) atmosphere, an oxygen atmosphere, or a mixed atmosphere containing a rare gas (typically argon) and oxygen. Specifically, it is preferable to employ, for example, an atmosphere of a high-purity gas from which an impurity such as hydrogen, water, a hydroxyl group, or hydride is removed so that the concentration of the impurity is 1 ppm or lower (preferably 10 ppb or lower).

When the oxide semiconductor film 530 is formed, an object to be processed is held in a treatment chamber that is maintained at reduced pressure and is heated so that the temperature of the object to be processed is higher than or equal to 100° C. and lower than 550° C., preferably higher than or equal to 200° C. and lower than or equal to 400° C. Alternatively, the temperature of the object to be processed in the formation of the oxide semiconductor film 530 may be room temperature (25° C.±10° C.). While moisture remaining in the treatment chamber is removed, a sputtering gas from which hydrogen, water and the like are removed is introduced, and the oxide semiconductor film 530 is formed with use of the target. When the oxide semiconductor film 530 is formed while the object to be processed is heated, impurities contained in the oxide semiconductor film 530 can be reduced. Further, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo pump provided with a cold trap may be used. By evacuation with the cryopump or the like, hydrogen, water, and the like can be removed from the treatment chamber, whereby the concentration of an impurity in the oxide semiconductor film 530 can be reduced.

For example, conditions for forming the oxide semiconductor film 530 can be set as follows: the distance between the object to be processed and the target is 170 mm, the pressure is 0.4 Pa, the direct current (DC) power is 0.5 kW, and the atmosphere is an oxygen (oxygen 100%) atmosphere, an argon (argon 100%) atmosphere, or a mixed atmosphere of oxygen and argon. Note that a pulsed direct current (DC) power source is preferably used because dust (such as powdery substances formed at the time of film formation) can be reduced and the film thickness can be uniform. The thickness of the oxide semiconductor film 530 is greater than or equal to 1 nm and less than or equal to 50 nm, preferably greater than or equal to 1 nm and less than or equal to 30 nm, further preferably greater than or equal to 1 nm and less than or equal to 10 nm. With use of the oxide semiconductor film 530 having such a thickness, a short-channel effect which occurs along with miniaturization can be suppressed. Note that the appropriate thickness differs depending on the oxide semiconductor material to be used, the intended use of the semiconductor device, or the like; therefore, the thickness may be determined in accordance with the material, the intended use, or the like.

Note that before the oxide semiconductor film 530 is formed by a sputtering method, reverse sputtering in which an argon gas is introduced and plasma is generated is preferably performed to remove a material attached to the surface where the oxide semiconductor film 530 is to be formed (e.g., a surface of the gate insulating layer 507). Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface to be processed under an argon atmosphere so that plasma is generated in the vicinity of the object to be processed. Note that an atmosphere of nitrogen, helium, oxygen, or the like may be used instead of an argon atmosphere.

Next, the oxide semiconductor film 530 is processed into an island-shaped oxide semiconductor layer through a second photolithography process. Note that a resist mask used in the photolithography process may be formed by an inkjet method. Formation of the resist mask by an inkjet method needs no photomask; thus, the manufacturing cost can be reduced.

In the case where a contact hole is formed in the gate insulating layer 507, a step of forming the contact hole can be performed at the same time as processing of the oxide semiconductor film 530.

For the etching of the oxide semiconductor film 530, one or both of wet etching and dry etching may be employed. As an etchant used for wet etching of the oxide semiconductor film 530, for example, a mixed solution of phosphoric acid, acetic acid, and nitric acid can be used. Alternatively, ITO07N (produced by Kanto Chemical Co., Inc.) may also be used.

Figure 8B:
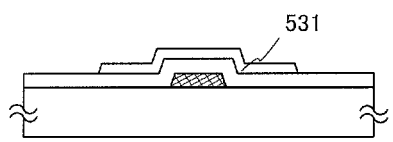
Figure 8C:
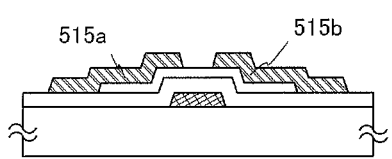

After that, heat treatment (first heat treatment) is performed on the oxide semiconductor layer, whereby the oxide semiconductor layer 531 is formed (see FIG. 8B). Excessive hydrogen (including water and a hydroxyl group) in the oxide semiconductor layer is removed by the first heat treatment and a structure of the oxide semiconductor layer is improved, so that defect level in an energy gap of the oxide semiconductor layer can be reduced. The temperature of the first heat treatment is, for example, higher than or equal to 300° C. and lower than 550° C. or higher than or equal to 400° C. and lower than or equal to 500° C.

The heat treatment can be performed in such a way that, for example, an object to be processed is introduced into an electric furnace including a resistance heating element or the like, and then heated at 450° C. for one hour under a nitrogen atmosphere. During the heat treatment, the oxide semiconductor layer is not exposed to the atmosphere to prevent the entry of water and hydrogen.

A heat treatment apparatus is not limited to an electric furnace, and may be an apparatus for heating an object to be processed by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high temperature gas. As the gas, an inert gas which does not react with an object to be processed in heat treatment, such as nitrogen, or a rare gas such as argon is used.

For example, as the first heat treatment, GRTA treatment may be performed in the following manner. The object to be processed is put in an inert gas atmosphere that has been heated, heated for several minutes, and taken out of the inert gas atmosphere. The GRTA treatment enables high-temperature heat treatment for a short time. Moreover, GRTA treatment can be employed even when the temperature exceeds the upper temperature limit of the object to be processed. Note that the inert gas may be switched to a gas including oxygen during the treatment. This is because defect level in an energy gap due to oxygen deficiency can be reduced by performing the first heat treatment under an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into the heat treatment apparatus is greater than or equal to 6N (99.9999%), preferably greater than or equal to 7 N (99.99999%) (i.e., the concentration of the impurity is less than or equal to 1 ppm, preferably less than or equal to 0.1 ppm).

In any case, impurities are reduced by the first heat treatment so that the i-type (intrinsic) or substantially i-type oxide semiconductor layer is formed. Accordingly, a transistor having significantly excellent characteristics can be realized.

The above heat treatment (first heat treatment) has the effect of removing hydrogen, water, and the like and thus can be referred to as dehydration treatment, dehydrogenation treatment, or the like. After the formation of the oxide semiconductor film 530, the dehydration treatment or the dehydrogenation treatment can be performed before the oxide semiconductor film 530 is processed into an island-shaped oxide semiconductor layer. Such dehydration treatment or dehydrogenation treatment may be performed once or plural times.

Other than the above timing, the first heat treatment can be performed at the following timing: after formation of the source electrode and drain electrode, after formation of the insulating layer over the source electrode and the drain electrode, or the like.

Next, a conductive film which serves as a source electrode or a drain electrode (including a wiring formed using the same layer as the electrode) is formed over the gate insulating layer 507 and the oxide semiconductor layer 531. As the conductive film used for the source electrode or the drain electrode, the material described in the above embodiment can be used.

Through a third photolithography process, a resist mask is formed over the conductive film and etching is performed selectively, so that the source or drain electrode 515a and the source or drain electrode 515b are formed. After that, the resist mask is removed (see FIG. 8C).

Light exposure at the time of the formation of the resist mask in the third photolithography process may be performed using ultraviolet light, a KrF laser beam, or an ArF laser beam. Note that the channel length (L) of the transistor is determined depending on the distance between the source electrode and the drain electrode. Thus, in the case where the channel length (L) of the transistor is less than 25 nm, light exposure for forming a mask is preferably performed with extreme ultraviolet light whose wavelength is short of several nanometers to several tens of nanometers. In the light exposure with extreme ultraviolet light, the resolution is high and the focus depth is large. For these reasons, the channel length (L) of the transistor formed later can be greater than or equal to 10 nm and less than or equal to 1000 nm (1 μm), and the circuit can operate at higher speed. Moreover, power consumption of the semiconductor device can be reduced by miniaturization.

In order to reduce the number of photomasks and steps in the photolithography process, an etching step may be performed with use of a resist mask formed with use of a multi-tone mask. A resist mask formed with use of a multi-tone mask has regions having different thicknesses and can be changed in shape by etching, so that the resist mask can be used in a plurality of etching steps for processing into different patterns. Thus, a resist mask corresponding to at least two or more kinds of different patterns can be formed with one multi-tone mask. Therefore, the number of light-exposure masks can be reduced and the number of corresponding photolithography steps can be also reduced, whereby simplification of a process can be realized.

Note that it is desirable that etching conditions be optimized so as to prevent the oxide semiconductor layer 531 from being etched and divided when the conductive film is etched. However, it is difficult to obtain etching conditions in which only the conductive film is etched and the oxide semiconductor layer 531 is not etched at all. In some cases, part of the oxide semiconductor layer 531 is etched and thus a groove portion (a depressed portion) is formed when the conductive film is etched.

Either wet etching or dry etching may be used for the etching of the conductive film. Note that dry etching is preferable in terms of element miniaturization. An etching gas and an etchant can be selected as appropriate depending on a material to be etched. In this embodiment, since a titanium film is used as the conductive film and the In—Ga—Zn—O-based material is used for the oxide semiconductor layer 531, when wet etching is employed, for example, an ammonia peroxide mixture (e.g., a 31 wt % hydrogen peroxide solution: 28 wt % ammonia water: water=5:2:2) can be used as an etchant of the titanium film.

Next, it is preferable that plasma treatment be performed using a gas such as $N_2O$, $N_2$, or Ar so that hydrogen or water attached to an exposed surface of the oxide semiconductor layer is removed. In the case where the plasma treatment is performed, an insulating layer 516 serving as a protective insulating film is formed without exposure to the atmosphere.

It is preferable that the insulating layer 516 be formed to a thickness of at least 1 nm or more by a method by which an impurity such as water or hydrogen does not enter the insulating layer 516, such as a sputtering method. If hydrogen is contained in the insulating layer 516, the hydrogen may enter the oxide semiconductor layer or extract oxygen in the oxide semiconductor layer, whereby the resistance of the backchannel of the oxide semiconductor layer might be decreased (to be n-type) and a parasitic channel might be formed. Further, it is preferable to use a silicon oxide film, a silicon oxynitride film, an aluminum oxide film, an aluminum oxynitride film, or the like as the insulating layer 516.

In this embodiment, as the insulating layer 516, a 200-nm-thick silicon oxide film is formed by a sputtering method. The substrate temperature in deposition is higher than or equal to room temperature (25° C.) and lower than or equal to 300° C. and is 100° C. in this embodiment. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target can be used.

As in the case of the formation of the oxide semiconductor film 530, in order to remove moisture remaining in the deposition in which the insulating layer 516 is formed, an entrapment vacuum pump (such as a cryopump) is preferably used. When the insulating layer 516 is formed in the deposition chamber evacuated using a cryopump, the impurity concentration of the insulating layer 516 can be reduced. Alternatively, as an evacuation means for removing the moisture remaining in the deposition chamber in which the insulating layer 516 is formed, a turbo pump provided with a cold trap may be used.

It is preferable that a high-purity gas from which an impurity such as hydrogen or water is removed be used as the sputtering gas for forming the insulating layer 516.

Next, second heat treatment is performed under an inert gas atmosphere or an oxygen atmosphere. The temperature of the heat treatment is greater than or equal to 200° C. and less than or equal to 450° C., preferably greater than or equal to 250° C. and less than or equal to 350° C. For example, the heat treatment may be performed at 250° C. for one hour under a nitrogen atmosphere. The second heat treatment can reduce variation in electric characteristics of the transistors. Moreover, oxygen is supplied from the insulating layer 516 to the oxide semiconductor layer 531 to compensate for oxygen deficiency in the oxide semiconductor layer 531, whereby an i-type (intrinsic) or substantially i-type oxide semiconductor layer can be formed.

Note that the second heat treatment is performed after the insulating layer 516 is formed in this embodiment; however, the timing of the second heat treatment is not particularly limited to this. For example, the second heat treatment may be performed following the first heat treatment or the first heat treatment may double as the second heat treatment.

As described above, by the first heat treatment and the second heat treatment, the oxide semiconductor layer 531 includes impurities which are not the main components as little as possible and is highly purified, whereby the oxide semiconductor layer 531 can be an i-type (intrinsic) oxide semiconductor layer.

Figure 8D:
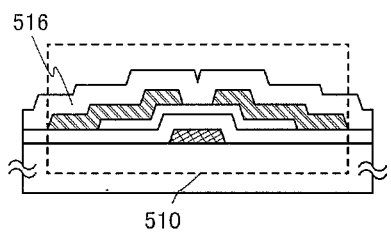

Through the above steps, the transistor 510 is formed (see FIG. 8D).

Figure 8E:
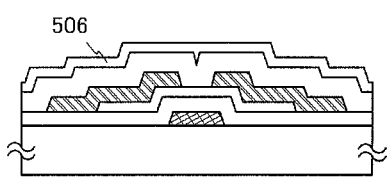

It is preferable that a protective insulating layer 506 be further formed over the insulating layer 516 (see FIG. 8E). The protective insulating layer 506 prevents entry of hydrogen, water, or the like from the outside. As the protective insulating layer 506, for example, a silicon nitride film, an aluminum nitride film, or the like can be used. Although there is no particular limitation on a method for forming the protective insulating layer 506, an RF sputtering method is suitable because it has high productivity. As the protective insulating layer 506, an organic material such as polyimide, acrylic, or benzocyclobutene can be used. With use of such an organic material, an insulating property can be further improved. The protective insulating layer 506 may be a stack of the above materials, and for example, a structure where a polyimide film is stacked over a silicon nitride film can be employed. The protective insulating layer 506 having such a structure can prevent entry of water, hydrogen, or the like and enhance the insulating property.

After the formation of the protective insulating layer 506, heat treatment may be performed at a temperature higher than or equal to 100° C. and lower than or equal to 200° C. for longer than or equal to one hour and shorter than or equal to 30 hours in the atmosphere.

In the transistor including the highly-purified oxide semiconductor layer formed according to this embodiment, leakage current can be sufficiently reduced. Thus, when the transistor is used for a boosting circuit, retention time of potential can be longer and the boosting efficiency can be enhanced in the boosting circuit.

The structures, methods, and the like described in this embodiment can be combined as appropriate with any of the structures, methods, and the like described in the other embodiments.

Embodiment 6

In this embodiment, a structure and a manufacturing method of a semiconductor device that can be applied to the boosting circuits and the RFID tag described in the above embodiments will be described with reference to FIG. 9, FIGS. 10A to 10D, FIGS. 11A to 11C, FIGS. 12A to 12C, and FIGS. 13A and 13B.

<Cross-Sectional Structure and Planar Structure of Semiconductor Device>

Figure 9:
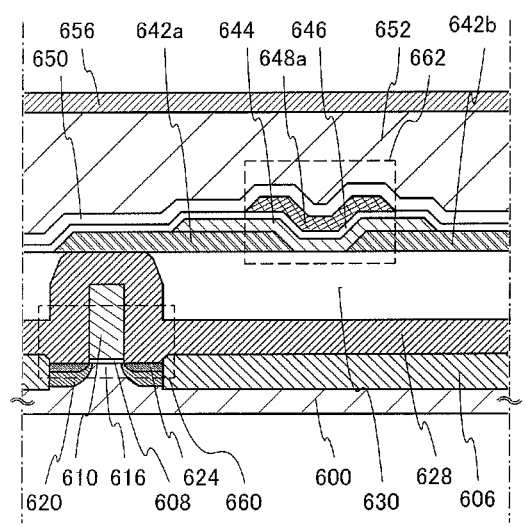
FIG. 9 is a cross-sectional view of a semiconductor device according to one embodiment of the disclosed invention.

FIG. 9 is a cross-sectional view illustrating an example of a structure of a semiconductor device. In the semiconductor device illustrated in FIG. 9, a transistor 660 including a first semiconductor material is provided in the lower portion and a transistor 662 including a second semiconductor material is provided in the upper portion. It is preferable that the first semiconductor material and the second semiconductor material differ from each other. For example, a semiconductor material other than an oxide semiconductor can be used as the first semiconductor material and an oxide semiconductor can be used as the second semiconductor material. The semiconductor material other than an oxide semiconductor can be, for example, silicon, germanium, silicon germanium, silicon carbide, and gallium arsenide, and is preferably a single-crystal semiconductor. Alternatively, an organic semiconductor material and the like may be used. A transistor formed using such a semiconductor material can easily operate at high speed. Meanwhile, a transistor including an oxide semiconductor enables to reduce the off-state current sufficiently.

For example, when the RFID tag described in Embodiment 3 is manufactured, the transistor 660 including a semiconductor material other than an oxide semiconductor in the lower portion can be used for formation of a logic circuit or a driver circuit which need high speed operation. Further, the transistor 662 including an oxide semiconductor in the upper portion can be used for formation of a memory circuit which needs an adequate period for charge retention, a rectifier circuit, a demodulation circuit, a modulation circuit, and the boosting circuit described in the above embodiment in which the boosting efficiency is enhanced, and the like. In the rectifier circuit, demodulation circuit, modulation circuit, and boosting circuit, a loss due to leakage current is preferably small. Then, with a structure where these circuits are integrated, an RFID tag having advantages of characteristics of the respective components can be achieved.

The analog switch 215 described in Embodiment 2 and a CMOS circuit which is used for a logic circuit or the like each include an n-channel transistor and a p-channel transistor in combination. When the transistor 660 including a semiconductor material other than an oxide semiconductor is used as a p-channel transistor and the transistor 662 including an oxide semiconductor material is used as an n-channel transistor, an analog switch, a CMOS circuit, or the like can be easily provided in an RFID tag with use of the semiconductor device illustrated in FIG. 9.

The transistor 660 illustrated in FIG. 9 includes a channel formation region 616 provided over a substrate 600 including a semiconductor material (e.g., silicon), impurity regions 620 by which the channel formation region 616 is interposed, metal compound regions 624 in contact with the impurity regions 620, a gate insulating layer 608 provided over the channel formation region 616, and a gate electrode 610 provided over the gate insulating layer 608. Note that a transistor whose source electrode and drain electrode are not illustrated obviously in a drawing may be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. In other words, the description of a source electrode may include a source region and the description of a drain electrode may include a drain region in this specification.

An element-isolation insulating layer 606 is provided over the substrate 600 so as to surround the transistor 660, and an insulating layer 628 and an insulating layer 630 are provided over the transistor 660. Although not shown, part of the metal compound region 624 in the transistor 660 is connected to a wiring through an electrode functioning as a source electrode or a drain electrode. For high integration, as illustrated in FIG. 9, it is preferable that the transistor 660 do not include a sidewall insulating layer. On the other hand, when the importance is put on the characteristics of the transistor 660, a sidewall insulating layer may be provided on a side surface of the gate electrode 610 and the impurity region 620 may include an impurity region having a different impurity concentration provided in a region overlapping with the sidewall insulating layer.

The transistor 662 in FIG. 9 includes a source or drain electrode 642a and a source or drain electrode 642b which are provided over an insulating layer 630, an oxide semiconductor layer 644 electrically connected to the source or drain electrode 642a and the source or drain electrode 642b, a gate insulating layer 646 covering the source or drain electrode 642a, the source or drain electrode 642b, and the oxide semiconductor layer 644, and a gate electrode 648a provided over the gate insulating layer 646 so as to overlap with the oxide semiconductor layer 644.

It is preferable that the oxide semiconductor layer 644 be formed using an oxide semiconductor which is similar to that of the oxide semiconductor layer 403 described in the above embodiment and be highly purified by sufficient removal of impurities such as hydrogen or sufficient supply of oxygen.

In the transistor 662 including the oxide semiconductor layer 644, leakage current can be sufficiently reduced. Thus, when the transistor is used for a boosting circuit, the boosting efficiency can be enhanced in the boosting circuit.

Note that in FIG. 9, the transistor 662 having a top-gate structure is illustrated as the transistor in the upper portion; however, there is no particular limitation on the structure of the transistor. For example, a staggered type or a planar type having a top-gate structure or a bottom-gate structure can be employed as appropriate. Further, the transistor may have a single-gate structure including one channel formation region, a double-gate structure including two channel formation regions, or a triple-gate structure including three channel formation regions. Alternatively, the transistor may have a dual-gate structure including two gate electrode layers positioned above and below a channel region with a gate insulating layer provided therebetween. For example, the transistor 410, the transistor 420, the transistor 430, or the transistor 440 illustrated in FIGS. 7A to 7D can be used instead of the transistor 662.

The oxide semiconductor layer 644 is preferably formed over a surface with favorable planarity of an insulating layer so that the oxide semiconductor layer 644 can have favorable planarity and uniformity. With use of the oxide semiconductor layer 644 having favorable planarity and uniformity, characteristics of the transistor 662 can be improved.

An insulating layer 650 is formed over the transistor 662, and an insulating layer 652 is formed over the insulating layer 650. Further, a wiring 656 which is connected to the transistor 660 or the transistor 662 is formed over the insulating layer 652.

<Method for Manufacturing Semiconductor Device>

Next, an example of a method for manufacturing the semiconductor device will be described. In the description below, first, a method for manufacturing the transistor 660 in the lower portion will be described with reference to FIGS. 10A to 10D and FIGS. 11A to 11C, and then, a method for manufacturing the transistor 662 in the upper portion will be described with reference to FIGS. 12A to 12C and FIGS. 13A and 13B.

<Method for Manufacturing Transistor in Lower Portion>

Figure 10A:
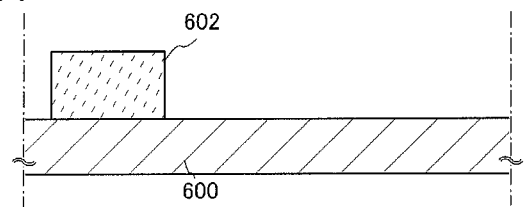
FIGS. 10A to 10D are cross-sectional views illustrating a manufacturing process of a semiconductor device according to one embodiment of the disclosed invention.
Figure 10B:
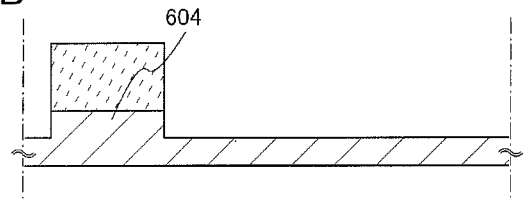

First, the substrate 600 including a semiconductor material is prepared (see FIG. 10A). As the substrate 600 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, all example of using a single crystal silicon substrate as the substrate 600 including a semiconductor material is described. Note that in general, the term an "SOI substrate" means a substrate in which a silicon semiconductor layer is provided on an insulating surface. In this specification and the like, the term an "SOI substrate" also includes a substrate in which a semiconductor layer formed using a material other than silicon is provided on an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

A protective layer 602 serving as a mask for forming an element-isolation insulating layer is formed over the substrate 600 (see FIG. 10A). As the protective layer 602, an insulating layer formed using silicon oxide, silicon nitride, silicon oxynitride, or the like can be used, for example. Note that before or after this step, an impurity element imparting n-type conductivity or an impurity element imparting p-type conductivity may be added to the substrate 600 in order to control the threshold potential of the transistor. When the semiconductor material included in the substrate 600 is silicon, as the impurity imparting n-type conductivity, phosphorus arsenic, or the like can be used; and as the impurity imparting p-type conductivity, boron, aluminum, gallium, or the like can be used.

Next, part of the substrate 600 in a region that is not covered with the protective layer 602 (i.e., in an exposed region) is removed by etching, using the protective layer 602 as a mask. Thus, a semiconductor region 604 which is isolated from other semiconductor regions is formed (see FIG. 10B). As the etching, although dry etching is preferably performed, wet etching may be performed. An etching gas and an etchant can be selected as appropriate depending on a material of a layer to be etched.

Figure 10C:
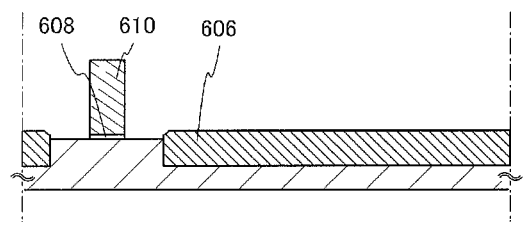

Then, an insulating layer is formed so as to cover the semiconductor region 604, and the insulating layer in a region overlapping with the semiconductor region 604 is selectively removed, so that element-isolation insulating layers 606 are formed (see FIG. 10C). The insulating layer is formed using silicon oxide, silicon nitride, silicon oxynitride, or the like. As a method for removing the insulating layer, etching treatment, polishing treatment such as chemical mechanical polishing (CMP), and the like are given and any of them can be employed. Note that the protective layer 602 is removed after the formation of the semiconductor region 604 or after the formation of the element-isolation insulating layers 606.

Note that as a method for forming the element-isolation insulating layer 606, a method in which an insulating region is formed by introduction of oxygen, or the like can be used instead of the method in which the insulating layer is selectively etched.

Next, an insulating layer is formed over a surface of the semiconductor region 604, and a layer including a conductive material is formed over the insulating layer.

The insulating layer serves as a gate insulating layer later, and can be formed by heat treatment (thermal oxidation treatment, thermal nitridation treatment, or the like) of the surface of the semiconductor region 604, for example. Instead of heat treatment, high-density plasma treatment may be performed. The high-density plasma treatment can be performed using, for example, a mixed gas of a rare gas such as He, Ar, Kr, or Xe and a gas such as oxygen, nitrogen oxide, ammonia, nitrogen, or hydrogen. Needless to say, the insulating layer may be formed by a CVD method, a sputtering method, or the like. The insulating layer preferably has a single-layer structure or a layered structure using a film including any of silicon oxide, silicon oxynitride, silicon nitride, hafnium oxide, aluminum oxide, tantalum oxide, yttrium oxide, hafnium silicate ($HfSi_xO_y$ ($x>0$, $y>0$)), hafnium silicate ($HfSi_xO_y$ ($x>0$, $y>0$)) to which nitrogen is added, hafnium aluminate ($HfAl_xO_y$ ($x>0$, $y>0$)) to which nitrogen is added, and the like. The thickness of the insulating layer can be, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed using a metal material.

After that, the insulating layer and the layer including a conductive material are selectively etched, so that the gate insulating layer 608 and the gate electrode 610 are formed (see FIG. 10C).

Figure 10D:
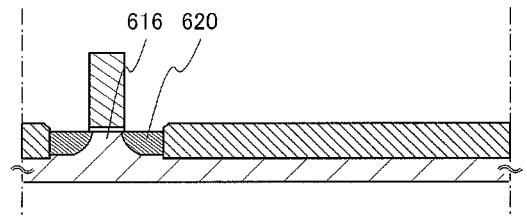

Next, the channel formation region 616 and the impurity regions 620 are formed by adding phosphorus (P), arsenic (As), or the like to the semiconductor region 604 (see FIG. 10D). Note that here, phosphorus or arsenic is added in order to form an n-channel transistor; an impurity element such as boron (B) or aluminum (Al) may be added in the case of forming a p-channel transistor. In this time, the concentration of the impurity added can be set as appropriate; the concentration is preferably increased when a semiconductor element is highly miniaturized.

Note that a sidewall insulating layer may be formed in the periphery of the gate electrode 610 to form an impurity region to which impurity elements are added at different concentrations.

Figure 11A:
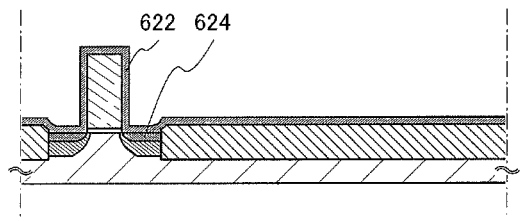
FIGS. 11A to 11C are cross-sectional views illustrating a manufacturing process of a semiconductor device according to one embodiment of the disclosed invention.

Then, a metal layer 622 is formed so as to cover the gate electrode 610, the impurity regions 620, and the like (see FIG. 11A). A variety of film formation methods such as a vacuum evaporation method, a sputtering method, or a spin coating method can be employed for forming the metal layer 622. The metal layer 622 is preferably formed using a metal material that reacts with a semiconductor material included in the semiconductor region 604 to form a low-resistance metal compound. Examples of such a metal material are titanium, tantalum, tungsten, nickel, cobalt, and platinum.

Next, heat treatment is performed so that the metal layer 622 reacts with the semiconductor material. Thus, the metal compound regions 624 that are in contact with the impurity regions 620 are formed (see FIG. 11A). Note that when the gate electrode 610 is formed using polycrystalline silicon or the like, a metal compound region is also formed in a region of the gate electrode 610 in contact with the metal layer 622.

As the heat treatment, irradiation with a flash lamp can be employed, for example. Although it is needless to say that another heat treatment method may be used, a method by which heat treatment for an extremely short time can be achieved is preferably employed in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 622 is removed after the metal compound regions 624 are formed.

Figure 11B:
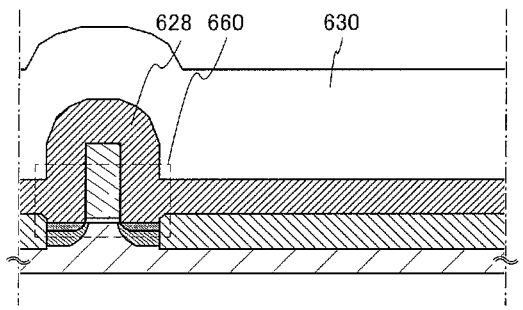

Then, the insulating layer 628 and the insulating layer 630 are formed so as to cover the components formed in the above steps (see FIG. 11B). The insulating layer 628 and the insulating layer 630 can be formed using a material including an inorganic insulating material such as silicon oxide, silicon oxynitride, aluminum oxide, silicon nitride oxide, or silicon nitride. It is particularly preferable to use a low dielectric constant (low-k) material for the insulating layer 628 and the insulating layer 630 because capacitance due to overlap of electrodes or wirings can be sufficiently reduced. Note that a porous insulating layer formed using such a material may be used as the insulating layer 628 and the insulating layer 630. A porous insulating layer has lower dielectric constant than an insulating layer with high density; thus, capacitance due to electrodes or wirings can be further reduced.

Note that, although a layered structure of the insulating layer 628 and the insulating layer 630 is employed here, one embodiment of the disclosed invention is not limited thereto. A single-layer structure or a layered structure of three or more layers may also be used.

Note that in this specification, "silicon oxynitride" contains more oxygen than nitrogen, and "silicon nitride oxide" contains more nitrogen than oxygen.

Through the above steps, the transistor 660 using the substrate 600 including a semiconductor material is formed (see FIG. 11B).

Figure 11C:
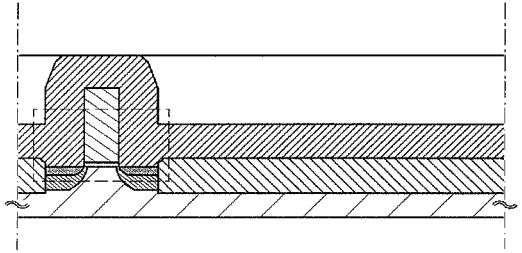

After that, as treatment performed before formation of the transistor 662, it is preferable that the insulating layer 628 and the insulating layer 630 be subjected to chemical mechanical polishing (CMP) treatment so that surfaces of the insulating layer 628 and the insulating layer 630 are planarized (see FIG. 11C). As treatment for planarizing the insulating layer 628 and the insulating layer 630, etching treatment or the like can be performed instead of CMP treatment. In order to improve the planarity and the uniformity of the oxide semiconductor layer 644 and improve the characteristics of the transistor 662, it is preferable that planarization be performed so that the surfaces of the insulating layer 628 and the insulating layer 630 have favorable planarity.

Note that before or after each of the above steps, a step for forming an additional electrode, wiring, semiconductor layer, insulating layer, or the like may be performed. For example, a multilayer wiring structure in which an insulating layer and a conductive layer are stacked is employed as a wiring structure, so that a highly-integrated semiconductor device can be provided.

<Method for Manufacturing Transistor in Upper Portion>

Figure 12A:
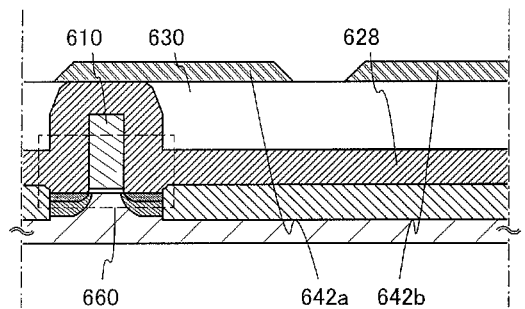
FIGS. 12A to 12C are cross-sectional views illustrating a manufacturing process of a semiconductor device according to one embodiment of the disclosed invention.

Next, a conductive layer is formed over the gate electrode 610, the insulating layer 628, the insulating layer 630, and the like, and the conductive layer is selectively etched, so that the source or drain electrode 642a and the source or drain electrode 642b are formed (see FIG. 12A).

The conductive layer can be formed by a PVD method typified by a sputtering method, or a CVD method such as a plasma CVD method. As a material of the conductive layer, a material similar to that of the source or drain electrode 405a and the source or drain electrode 405b described in the above embodiment can be used. Thus, the above embodiment can be referred to for the details.

The conductive layer is preferably etched so that edge portions of the source or drain electrode 642a and the source or drain electrode 642b are tapered. Here, the tapered angle is preferably greater than or equal to 30° and less than or equal to 60°, for example. When etching is performed so that the edge portions of the source or drain electrode 642a and the source or drain electrode 642b are tapered, the coverage with the gate insulating layer 646 to be formed later can be improved and disconnection can be prevented.

Note that the channel length (L) of the transistor in the upper portion is determined by a distance between a lower end portion of the source or drain electrode 642a and a lower end portion of the source or drain electrode 642b. Note that in the case where the channel length (L) of the transistor is less than 25 nm, light exposure for forming a mask is preferably performed with extreme ultraviolet light whose wavelength is short of several nanometers to several tens of nanometers. In the light exposure with extreme ultraviolet light, the resolution is high and the focus depth is large. For these reasons, the channel length (L) of the transistor formed later can be greater than or equal to 10 nm and less than or equal to 1000 nm (1 μm), and the circuit can operate at higher speed. Moreover, power consumption of the semiconductor device can be reduced by miniaturization.

Note that an insulating layer functioning as a base may be provided over the insulating layer 628 and the insulating layer 630. The insulating layer can be formed by a PVD method, a CVD method, or the like.

Figure 12B:
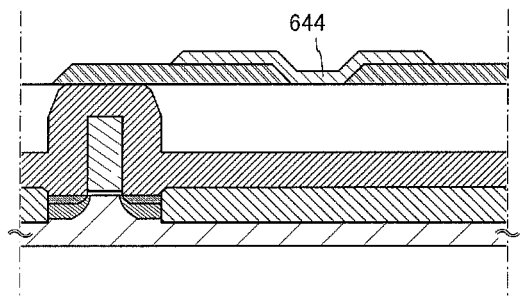

Next, an oxide semiconductor layer is formed so as to cover the source or drain electrode 642a and the source or drain electrode 642b, and then the oxide semiconductor layer is selectively etched, so that the oxide semiconductor layer 644 is formed (see FIG. 12B).

The oxide semiconductor layer 644 can be formed using a material and a method similar to those of the oxide semiconductor layer 531 described in the above embodiment. The above embodiment can be referred to for the details.

Note that before the oxide semiconductor layer is formed by a sputtering method, reverse sputtering in which an argon gas is introduced and plasma is generated is preferably performed to remove a material attached to the surface where the oxide semiconductor layer is to be formed (e.g., a surface of the insulating layer 630). Here, the reverse sputtering is a method by which ions collide with a surface to be processed of the substrate so that the surface is modified, in contrast to normal sputtering by which ions collide with a sputtering target. An example of a method for making ions collide with a surface to be processed is a method in which high-frequency voltage is applied to the surface to be processed under an argon atmosphere so that plasma is generated in the vicinity of the object to be processed. Note that an atmosphere of nitrogen, helium, oxygen, or the like may be used instead of an argon atmosphere.

After that, heat treatment (first heat treatment) is preferably performed on the oxide semiconductor layer. Excessive hydrogen (including water and a hydroxyl group) in the oxide semiconductor layer is removed by the first heat treatment and a structure of the oxide semiconductor layer is improved, so that defect level in energy gap of the oxide semiconductor layer can be reduced. Impurities are reduced by the first heat treatment so that the i-type (intrinsic) or substantially i-type oxide semiconductor layer is obtained. Accordingly, a transistor having significantly excellent characteristics can be realized. Note that the first heat treatment can be performed by a method which is the same or substantially the same as that described in Embodiment 5 and thus Embodiment 5 can be referred to for the details of a method of the first heat treatment.

The above heat treatment (first heat treatment) has the effect of removing hydrogen, water, and the like and thus can be referred to as dehydration treatment, dehydrogenation treatment, or the like. The dehydration treatment or the dehydrogenation treatment can be performed after formation of the oxide semiconductor layer, formation of the gate insulating layer, formation of the gate electrode, or the like. Such dehydration treatment or dehydrogenation treatment may be performed once or plural times.

The oxide semiconductor layer may be etched either before or after the heat treatment. In view of miniaturization of elements, dry etching is preferably used; however, wet etching may be used. An etching gas and an etchant can be selected as appropriate depending on a material of layers to be etched. Note that in the case where leakage current in an element does not cause a problem, the oxide semiconductor layer may be used without being processed to have an island shape.

Figure 12C:
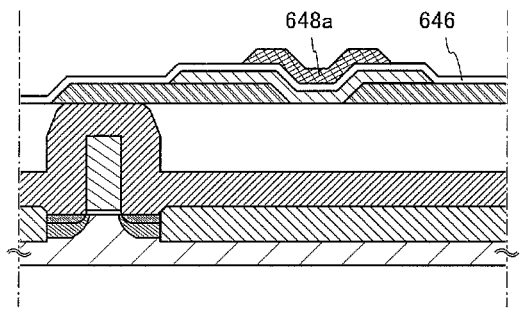

Next, the gate insulating layer 646 in contact with the oxide semiconductor layer 644 is formed, and then the gate electrode 648a is formed in a region overlapping with the oxide semiconductor layer 644 over the gate insulating layer 646 (see FIG. 12C).

The gate insulating layer 646 can be formed by a CVD method, a sputtering method, or the like. The gate insulating layer 646 preferably includes silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 646 may have a single-layer structure or a layered structure. There is no particular limitation on the thickness of the gate insulating layer 646; in the case where the semiconductor device is miniaturized, the gate insulating layer 646 is preferably thin in order to secure operation of the transistor. In the case of using silicon oxide, the thickness of the insulating layer 646 can be greater than or equal to 1 nm and less than or equal to 100 nm, preferably greater than or equal to 10 nm and less than or equal to 50 nm, for example.

For formation of the gate insulating layer 646, the second heat treatment is preferably performed under an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour under a nitrogen atmosphere. The second heat treatment can reduce variation in electric characteristics of the transistors.

Moreover, in the case where the gate insulating layer 646 includes oxygen, oxygen is supplied to the oxide semiconductor layer 644 to compensate for oxygen deficiency in the oxide semiconductor layer 644, whereby an i-type (intrinsic) or substantially i-type oxide semiconductor layer can be formed.

Note that in this embodiment, the second heat treatment is performed after the gate insulating layer 646 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, at least one of the first heat treatment and the second heat treatment is performed, whereby the oxide semiconductor layer 644 can be highly purified so as to contain impurities which are not main components as little as possible.

The gate electrode 648a can be formed in such a manner that a conductive layer is formed over the gate insulating layer 646 and then etched selectively. The conductive layer to be processed into the gate electrode 648a can be formed by a PVD method typified by a sputtering method or a CVD method such as a plasma CVD method. The details are similar to those of the source or drain electrode 642a or the like; thus, description thereof can be referred to.

Figure 13A:
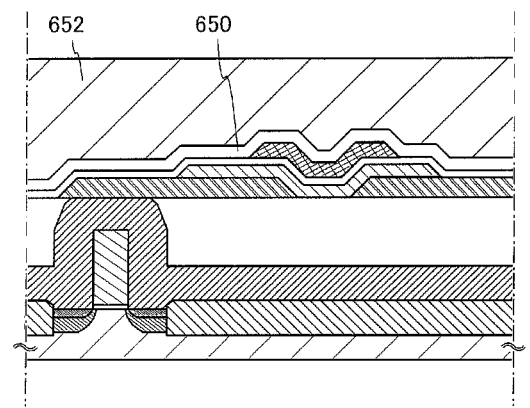
FIGS. 13A and 13B are cross-sectional views illustrating a manufacturing process of a semiconductor device according to one embodiment of the disclosed invention.

Next, the insulating layer 650 and the insulating layer 652 are formed over the gate insulating layer 646 and the gate electrode 648a (see FIG. 13A). The insulating layer 650 and the insulating layer 652 can be formed by a PVD method, a CVD method, or the like. A material containing an inorganic insulating material such as silicon oxide, silicon oxynitride, silicon nitride, hafnium oxide, or aluminum oxide can be used for the insulating layer 650 and the insulating layer 652.

Note that a low dielectric constant material or a structure having a low dielectric constant (e.g., a porous structure) is preferably employed for the insulating layer 650 and the insulating layer 652 because when the insulating layer 650 and the insulating layer 652 each have a low dielectric constant, capacitance generated between wirings, electrodes, or the like can be reduced and thus, high-speed operation can be obtained.

Note that, although a layered structure of the insulating layer 650 and the insulating layer 652 is employed in this embodiment, one embodiment of the disclosed invention is not limited thereto. A single-layer structure or a layered structure of three or more layers may also be used. Alternatively, it is possible to employ a structure where an insulating layer is not provided.

Note that the insulating layer 652 is preferably formed so as to have a planarized surface. By forming the insulating layer 652 so as to have a planarized surface, an electrode, a wiring, or the like can be favorably formed over the insulating layer 652 even in the case where the semiconductor device is miniaturized, for example. The insulating layer 652 can be planarized using a method such as CMP.

Figure 13B:
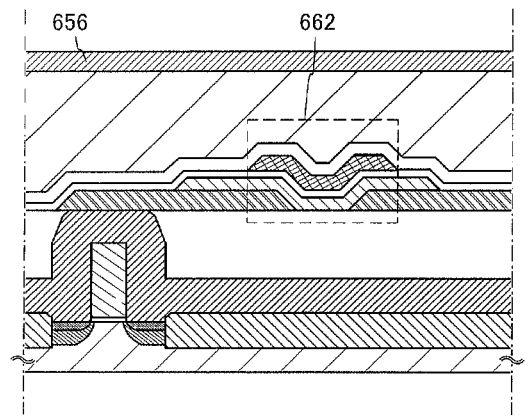

An electrode (not shown) for electrically connecting the transistor 660 or the transistor 662 and the wiring 656 is formed, and then the wiring 656 is formed over the insulating layer 652 (see FIG. 13B). Needless to say, all of these elements are not electrically connected to each other necessarily. An element independent from the other elements may be included.

The wiring 656 is formed in such a manner that a conductive layer is formed by a PVD method typified by a sputtering method or a CVD method such as a plasma CVD method and then the conductive layer is patterned. As a material of the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, beryllium, neodymium, and scandium may be used. The details are similar to those of the source or drain electrode 642a or the like.

Through the above steps, the transistor 662 including the highly-purified oxide semiconductor layer 644 is completed (see FIG. 13B).

With use of the highly-purified intrinsic oxide semiconductor layer 644, off current of the transistor 662 can be sufficiently reduced.

As described above, the semiconductor device can be provided, in which the transistor including a semiconductor material other than an oxide semiconductor is included in the lower portion and the transistor including an oxide semiconductor is included in the upper portion.

With a combination of the transistor including a semiconductor material other than an oxide semiconductor and the transistor including an oxide semiconductor as described above, a novel RFID tag making use of advantages of characteristics of the respective transistors can be realized.

In the transistor including the highly-purified oxide semiconductor layer formed according to this embodiment, leakage current can be sufficiently reduced. Thus, when the transistor is used for a boosting circuit, retention time of potential can be longer and the boosting efficiency can be enhanced in the boosting circuit.

In addition, the semiconductor device can be provided, in which the transistor whose transistor characteristics are improved by providing the oxide semiconductor layer over the surface with favorable planarity is stacked over the transistor including a semiconductor material other than an oxide semiconductor.

The structures, methods, and the like described in this embodiment can be combined as appropriate with any of the structures, methods, and the like described in the other embodiments.

This application is based on Japanese Patent Application serial no. 2010-045752 filed with Japan Patent Office on Mar. 2, 2010, the entire contents of which are hereby incorporated by reference.

The invention claimed is:

1. A boosting circuit comprising n stages of unit boosting circuits electrically connected to each other in series (n is a natural number and an even number), each unit boosting circuit comprising:
a first transistor comprising a first gate electrode, a first source electrode, and a first drain electrode;
a second transistor comprising a second gate electrode, a second source electrode, and a second drain electrode;
a third transistor comprising a third gate electrode, a third source electrode, and a third drain electrode;
a fourth transistor comprising a fourth gate electrode, a fourth source electrode, and a fourth drain electrode;
a first capacitor;
a second capacitor; and
an analog switch comprising a first terminal, a second terminal, a third terminal, and a fourth terminal,
wherein the first gate electrode, one of the first source electrode and the first drain electrode, one of the second source electrode and the second drain electrode, and one of the fourth source electrode and the fourth drain electrode are electrically connected to one another,
wherein the other of the first source electrode and the first drain electrode, the second gate electrode, one electrode of the first capacitor, and the fourth gate electrode are electrically connected to one another,
wherein the other of the second source electrode and the second drain electrode, the other electrode of the first capacitor, and one of the third source electrode and the third drain electrode are electrically connected to one another,
wherein the other of the third source electrode and the third drain electrode and a low-potential power supply are electrically connected to each other,
wherein the other of the fourth source electrode and the fourth drain electrode, one electrode of the second capacitor, and the first terminal of the analog switch are electrically connected to one another,
wherein the one of the first source electrode and the first drain electrode in a first stage unit boosting circuit is configured to be input an input signal,
wherein the third gate electrode and the other electrode of the second capacitor in a (2M−1)th stage unit boosting circuit is configured to be input a clock signal (M is a natural number which satisfies 1≤M≤n/2),
wherein the third gate electrode and the other electrode of the second capacitor in the 2M-th stage unit boosting circuit is configured to be input an inverted clock signal,
wherein the second terminal of the analog switch is configured to be input the clock signal and the third terminal of the analog switch is configured to be input the inverted clock signal in a (2M−1)th stage unit boosting circuit,
wherein the second terminal of the analog switch is configured to be input the inverted clock signal and the third terminal of the analog switch is configured to be input the clock signal in the 2M-th stage unit boosting circuit,
wherein the other of the fourth source electrode and the fourth drain electrode in an n-th stage unit boosting circuit is configured to output a signal obtained by boosting the input signal,
wherein a potential of the low-potential power supply is lower than a potential of the input signal, and
wherein the fourth terminal of the analog switch in a (K−1)th stage unit boosting circuit (K is a natural which satisfies 2≤K≤n) is electrically connected to the one of the first source electrode and the first drain electrode in a K-th stage unit boosting circuit.

2. The boosting circuit according to claim 1, wherein the analog switch further comprises:
a fifth transistor that is an n-channel transistor comprising a fifth gate electrode, a fifth source electrode, and a fifth drain electrode; and
a sixth transistor that is a p-channel transistor comprising a sixth gate electrode, a sixth source electrode, and a sixth drain electrode,
wherein one of the fifth source electrode and the fifth drain electrode and one of the sixth source electrode and the sixth drain electrode are electrically connected to each other so as to function as the first terminal of the analog switch,
wherein the fifth gate electrode or the sixth gate electrode functions as the second terminal of the analog switch or the third terminal of the analog switch, and
wherein the other of the fifth source electrode and the fifth drain electrode and the other of the sixth source electrode and the sixth drain electrode are electrically connected to each other so as to function as the fourth terminal of the analog switch.

3. The boosting circuit according to claim 2, wherein the fifth transistor comprises an oxide semiconductor material.

4. The boosting circuit according to claim 1, wherein the fourth transistor comprises an oxide semiconductor material.

5. The boosting circuit according to claim 1, wherein the first transistor and the second transistor each comprise an oxide semiconductor material.

6. An RFID tag comprising the boosting circuit according to claim 1.

7. A boosting circuit comprising:
a first transistor comprising a first gate electrode, a first source electrode, and a first drain electrode;
a second transistor comprising a second gate electrode, a second source electrode, and a second drain electrode;
a first capacitor; and
a second capacitor,
wherein the first gate electrode, one of the first source electrode and the first drain electrode, and one of the second source electrode and the second drain electrode are electrically connected to one another,
wherein the other of the first source electrode and the first drain electrode, the second gate electrode, one electrode of the first capacitor, and one electrode of the second capacitor are electrically connected to one another,
wherein the other of the second source electrode and the second drain electrode and the other electrode of the first capacitor are electrically connected to each other,
wherein the one of the first source electrode and the first drain electrode is configured to be input an input signal,
wherein the other electrode of the second capacitor is configured to be input a clock signal, and
wherein the other of the first source electrode and the first drain electrode is configured to output a signal obtained by boosting the input signal.

8. The boosting circuit according to claim 7, wherein the first transistor and the second transistor each comprises an oxide semiconductor material.

9. An RFID tag comprising the boosting circuit according to claim 7.

10. A boosting circuit comprising n stages of unit boosting circuits electrically connected to each other in series (n is a natural number and an even number), each unit boosting circuit comprising:
a first transistor comprising a first gate electrode, a first source electrode, and a first drain electrode;
a second transistor comprising a second gate electrode, a second source electrode, and a second drain electrode;
a first capacitor; and
a second capacitor,
wherein the first gate electrode, one of the first source electrode and the first drain electrode, and one of the second source electrode and the second drain electrode are electrically connected to one another,
wherein the other of the first source electrode and the first drain electrode, the second gate electrode, one electrode of the first capacitor, and one electrode of the second capacitor are electrically connected to one another,
wherein the other of the second source electrode and the second drain electrode and the other electrode of the first capacitor are electrically connected to each other,
wherein the one of the first source electrode and the first drain electrode in a first stage unit boosting circuit is configured to be input an input signal,
wherein the other electrode of the second capacitor in a (2M−1)th stage unit boosting circuit is configured to be input a clock signal (M is a natural number which satisfies $1 \leq M \leq n/2$),
wherein the other electrode of the second capacitor in a 2M-th stage unit boosting circuit is configured to be input an inverted clock signal, and
wherein the other of the first source electrode and the first drain electrode in an n-th stage unit boosting circuit is configured to output a signal obtained by boosting the input signal.

11. The boosting circuit according to claim 10, wherein the unit boosting circuit further comprises:
a third transistor comprising a third gate electrode, a third source electrode, and a third drain electrode,
wherein one of the third source electrode and the third drain electrode, the other of the second source electrode and the second drain electrode, and the other electrode of the first capacitor are electrically connected to one another,
wherein the other of the third source electrode and the third drain electrode and a low-potential power supply are electrically connected to each other,
wherein the third gate electrode is configured to be input a reset signal, and
wherein a potential of the low-potential power supply is lower than a potential of the input signal.

12. The boosting circuit according to claim 10, wherein the first transistor and the second transistor each comprise an oxide semiconductor material.

13. An RFID tag comprising the boosting circuit according to claim 10.

14. A boosting circuit comprising n stages of unit boosting circuits electrically connected to each other in series (n is a natural number greater than one), each unit boosting circuit comprising:
a first transistor comprising a first gate electrode, a first source electrode, and a first drain electrode;
a second transistor comprising a second gate electrode, a second source electrode, and a second drain electrode;
a first capacitor; and
a second capacitor,
wherein the first gate electrode, one of the first source electrode and the first drain electrode, and one of the second source electrode and the second drain electrode are electrically connected to one another,
wherein the other of the first source electrode and the first drain electrode, the second gate electrode, one electrode of the first capacitor, and one electrode of the second capacitor are electrically connected to one another,
wherein the other of the second source electrode and the second drain electrode and the other electrode of the first capacitor are electrically connected to each other,
wherein the one of the first source electrode and the first drain electrode in a first stage unit boosting circuit is configured to be input an input signal,
wherein the other of the first source electrode and the first drain electrode in an n-th stage unit boosting circuit is configured to output a signal obtained by boosting the input signal,
wherein the other electrode of the second capacitor in the n-th stage unit boosting circuit is configured to be input an inverted clock signal,
wherein, for all values of M, where M is a natural number which satisfies $1 \leq M \leq (n-1)$:
when n is an even number and M is an odd number, or n is an odd number and M is an even number, the other electrode of the second capacitor in a M-th stage unit boosting circuit is configured to be input a clock signal, and when n is an even number and M is an even number, or n is an odd number and M is an odd number, the other electrode of the second capacitor in the M-th stage unit boosting circuit is configured to be input an inverted clock signal.

15. The boosting circuit according to claim 14,
wherein the unit boosting circuit further comprises:
a third transistor comprising a third gate electrode, a third source electrode, and a third drain electrode,
wherein one of the third source electrode and the third drain electrode, the other of the second source electrode and the second drain electrode, and the other electrode of the first capacitor are electrically connected to one another,
wherein the other of the third source electrode and the third drain electrode and a low-potential power supply are electrically connected to each other,
wherein the third gate electrode is configured to be input a reset signal, and
wherein a potential of the low-potential power supply is lower than a potential of the input signal.

16. The boosting circuit according to claim 14, wherein the first transistor and the second transistor each comprise an oxide semiconductor material.

17. An RFID tag comprising the boosting circuit according to claim 14.

18. A boosting circuit comprising n stages of unit boosting circuits electrically connected to each other in series (n is a natural number greater than one), each unit boosting circuit comprising:
a first transistor comprising a first gate electrode, a first source electrode, and a first drain electrode;
a second transistor comprising a second gate electrode, a second source electrode, and a second drain electrode;
a third transistor comprising a third gate electrode, a third source electrode, and a third drain electrode;
a fourth transistor comprising a fourth gate electrode, a fourth source electrode, and a fourth drain electrode;
a first capacitor;
a second capacitor; and
an analog switch comprising a first terminal, a second terminal, a third terminal, and a fourth terminal,
wherein the first gate electrode, one of the first source electrode and the first drain electrode, one of the second source electrode and the second drain electrode, and one of the fourth source electrode and the fourth drain electrode are electrically connected to one another,
wherein the other of the first source electrode and the first drain electrode, the second gate electrode, one electrode of the first capacitor, and the fourth gate electrode are electrically connected to one another,
wherein the other of the second source electrode and the second drain electrode, the other electrode of the first capacitor, and one of the third source electrode and the third drain electrode are electrically connected to one another,
wherein the other of the third source electrode and the third drain electrode and a low-potential power supply are electrically connected to each other,
wherein the other of the fourth source electrode and the fourth drain electrode, one electrode of the second capacitor, and the first terminal of the analog switch are electrically connected to one another, wherein the one of the first source electrode and the first drain electrode in a first stage unit boosting circuit is configured to be input an input signal,
wherein a potential of the low-potential power supply is lower than a potential of the input signal,
wherein the fourth terminal of the analog switch in a (K−1) th stage unit boosting circuit (K is a natural number which satisfies 2≤K≤n) is electrically connected to the one of the first source electrode and the first drain electrode in a K-th stage unit boosting circuit,
wherein the other of the fourth source electrode and the fourth drain electrode in an n-th stage unit boosting circuit is configured to output a signal obtained by boosting the input signal,
wherein the other electrode of the second capacitor in the n-th stage unit boosting circuit is configured to be input an inverted clock signal, and
wherein, for all values of M, where M is a natural number which satisfies 1≤M≤(n−1):
when n is an even number and M is an odd number, or n is an odd number and M is all even number, in a M-th stage:
the third gate electrode and the other electrode of the second capacitor is configured to be input a clock signal;
the second terminal of the analog switch is configured to be input a clock signal; and
the third terminal of the analog switch is configured to be input an inverted clock signal, and
when n is all even number and M is an even number, or n is an odd number and M is an odd number, in the M-th stage:
the third gate electrode and the other electrode of the second capacitor is configured to be input an inverted clock signal;
the second terminal of the analog switch is configured to be input an inverted clock signal; and
the third terminal of the analog switch is configured to be input a clock signal.

19. The boosting circuit according to claim 18,
wherein the analog switch further comprises:
a fifth transistor that is an n-channel transistor comprising a fifth gate electrode, a fifth source electrode, and a fifth drain electrode; and
a sixth transistor that is a p-channel transistor comprising a sixth gate electrode, a sixth source electrode, and a sixth drain electrode,
wherein one of the fifth source electrode and the fifth drain electrode and one of the sixth source electrode and the sixth drain electrode are electrically connected to each other so as to function as the first terminal of the analog switch,
wherein the fifth gate electrode or the sixth gate electrode functions as the second terminal of the analog switch or the third terminal of the analog switch, and
wherein the other of the fifth source electrode and the fifth drain electrode and the other of the sixth source electrode and the sixth drain electrode are electrically connected to each other so as to function as the fourth terminal of the analog switch.

20. The boosting circuit according to claim 19, wherein the fifth transistor comprises an oxide semiconductor material.

21. The boosting circuit according to claim 18, wherein the fourth transistor comprises an oxide semiconductor material.

22. The boosting circuit according to claim 18, wherein the first transistor and the second transistor each comprise an oxide semiconductor material.

23. An RFID tag comprising the boosting circuit according to claim 18.

\* \* \* \* \*

UNITED STATES PATENT AND TRADEMARK OFFICE
CERTIFICATE OF CORRECTION

| | | |
|---|---|---|
| PATENT NO. | : 8,593,840 B2 | Page 1 of 1 |
| APPLICATION NO. | : 13/031715 | |
| DATED | : November 26, 2013 | |
| INVENTOR(S) | : Yutaka Shionoiri et al. | |

It is certified that error appears in the above-identified patent and that said Letters Patent is hereby corrected as shown below:

In the Specifications

Column 8, line 13, before "is" replace "in" with --*m*--;

Column 13, line 12, replace "in" with --*m*--;

Column 14, line 48, before "is" replace "in" with --*m*--;

Column 15, line 20, after "analog" delete ",";

Column 19, line 28, replace "$V_L$" with --$V_H$--;

Column 19, line 29, replace "manlier" with --manner--;

Column 21, line 26, replace "First" with --first--;

Column 22, line 63, replace "performer" with --performs--;

Column 24, line 22, replace "all" with --an--;

Column 24, line 42, replace "all" with --an--;

Column 25, line 42, replace "inn" with --nm--;

Column 25, line 47, replace "4056" with --405b--;

Column 27, line 41, after "preferable" replace "," with --.--;

Column 35, line 22, replace "all" with --an--;

Column 38, line 9, replace "6426" with --642b--;

Column 38, line 20, replace "6426" with --642b--;

Column 38, line 48, replace "6426" with --642b--;

In the Claims

Column 46, line 22, in claim 18 replace "all" with --an--;

Column 46, line 29, in claim 18 replace "all" with --an--.

Signed and Sealed this
Twenty-ninth Day of April, 2014

Michelle K. Lee
*Deputy Director of the United States Patent and Trademark Office*